(12) United States Patent
Lee et al.

(10) Patent No.: US 12,324,364 B2
(45) Date of Patent: Jun. 3, 2025

(54) MEMORY DEVICE AND OPERATING METHOD THEREOF

(71) Applicant: Taiwan Semiconductor Manufacturing Company, Ltd., Hsinchu (TW)

(72) Inventors: Tung-Ying Lee, Hsinchu (TW); Shao-Ming Yu, Hsinchu County (TW); Kai-Tai Chang, Kaohsiung (TW); Hung-Li Chiang, Taipei (TW); Yu-Sheng Chen, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1009 days.

(21) Appl. No.: 17/363,032

(22) Filed: Jun. 30, 2021

(65) Prior Publication Data

US 2022/0285617 A1    Sep. 8, 2022

Related U.S. Application Data

(60) Provisional application No. 63/156,953, filed on Mar. 5, 2021.

(51) Int. Cl.
*H10N 70/20* (2023.01)
*G11C 13/00* (2006.01)
*H10B 63/00* (2023.01)
*H10N 70/00* (2023.01)

(52) U.S. Cl.
CPC ....... *H10N 70/841* (2023.02); *G11C 13/0069* (2013.01); *H10B 63/80* (2023.02); *H10N 70/882* (2023.02); *H10N 70/8833* (2023.02)

(58) Field of Classification Search
CPC .................................................. H10N 70/826
See application file for complete search history.

(56) References Cited

U.S. PATENT DOCUMENTS

2024/0324479 A1* 9/2024 Ikarashi ............... H10N 70/841

* cited by examiner

*Primary Examiner* — Mark V Prenty
(74) *Attorney, Agent, or Firm* — JCIPRNET

(57) ABSTRACT

A memory device is provided. The memory device includes a bottom electrode, a first data storage layer, a second data storage layer, an interfacial conductive layer and a top electrode. The first data storage layer is disposed on the bottom electrode and in contact with the bottom electrode. The second data storage layer is disposed over the first data storage layer. The interfacial conductive layer is disposed between the first data storage layer and the second data storage layer. The top electrode is disposed over the second data storage layer.

20 Claims, 17 Drawing Sheets

MEMORY DEVICE AND OPERATING METHOD THEREOF

CROSS-REFERENCE TO RELATED APPLICATION

This application claims the priority benefit of U.S. provisional applications Ser. No. 63/156,953, filed on Mar. 5, 2021. The entirety of the above-mentioned patent application is hereby incorporated by reference herein and made a part of this specification.

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging. Semiconductor processing for fabrications of the semiconductor devices and ICs continues to evolve towards increasing device-density and higher numbers of semiconductor electronic components (e.g., transistors used for logic processing and memories used for storing information) of ever decreasing device dimensions. For example, the memories include non-volatile memory devices, where the non-volatile memory devices are capable of retaining data even after power is cut off. The non-volatile memory devices include resistive random-access memories and/or phase change random access memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
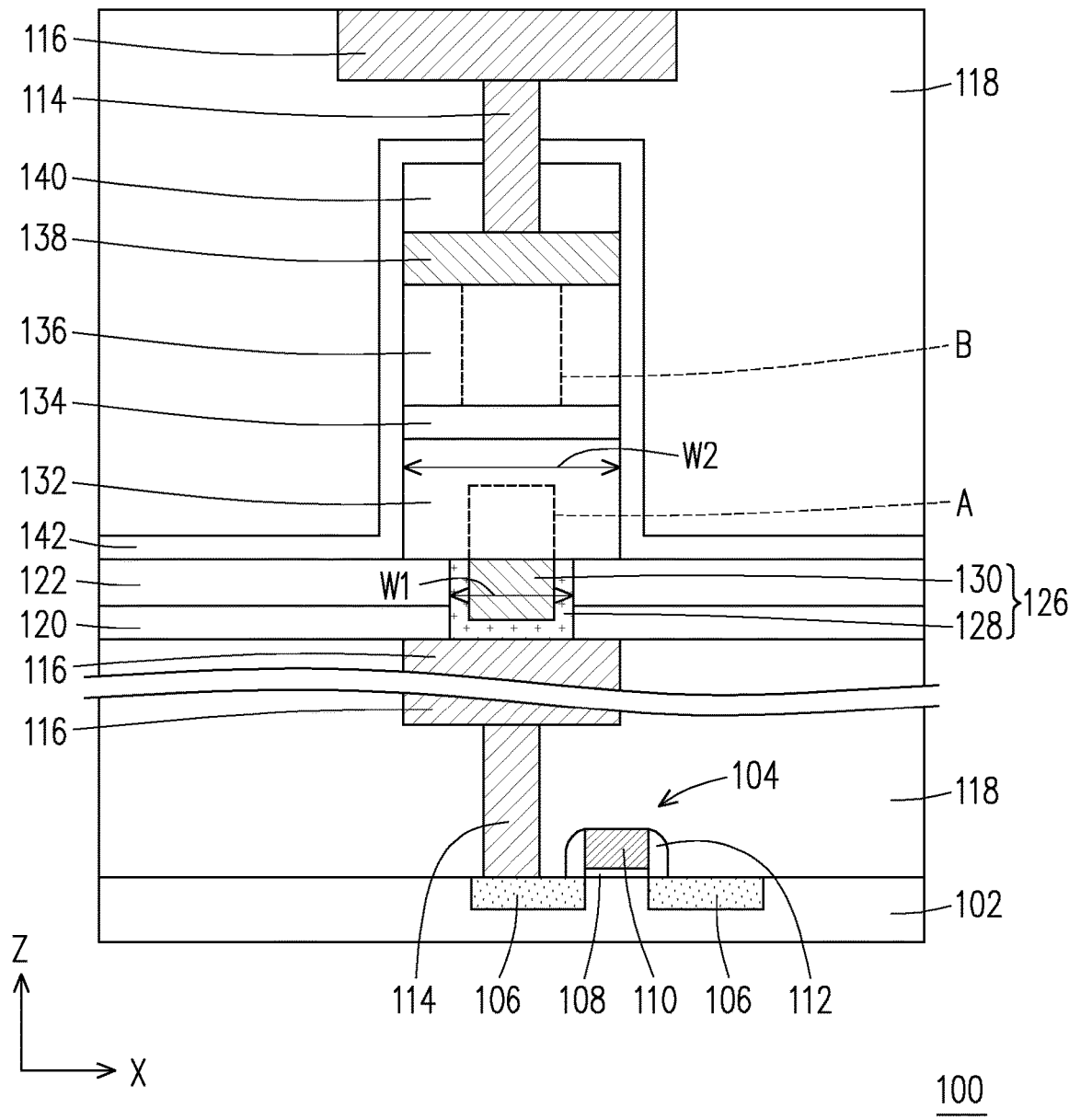
FIG. 1 is a schematic cross-sectional view illustrating a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view illustrating a memory device 100 according to some embodiments of the present disclosure.

Referring to FIG. 1, the memory device 100 includes a substrate 102 and a memory cell 124 overlying the substrate 102. An interconnect dielectric structure 118 overlies the substrate 102. The memory cell 124 is disposed within the interconnect dielectric structure 118. A plurality of conductive vias 114 and a plurality of conductive wires 116 are disposed within the interconnect dielectric structure 118 and are configured to electrically couple conductive structures and/or semiconductor devices to one another. A semiconductor device 104 is formed on a surface region of the substrate 102. In some embodiments, the semiconductor device 104 may be configured as a transistor. In such embodiments, the semiconductor device 104 includes source/drain regions 106, a gate dielectric layer 108, a gate electrode 110, and a sidewall spacer structure 112. A passivation layer 142 covers the memory cell 124. An etch stop layer 120 and a dielectric layer 122 are disposed within the interconnect dielectric structure 118 and along a top surface of an underlying conductive wire 116 within the plurality of conductive wires 116. The dielectric layer 122 is disposed on the etch stop layer 120.

In some embodiments, the substrate 102 is a bulk substrate (e.g., a bulk silicon substrate), a silicon-on-insulator (SOI) substrate, or other suitable material. Generally, an SOI substrate includes a layer of a semiconductor material, such as silicon, formed on an insulator layer. The insulator layer may be, for example, a buried oxide (BOX) layer or a silicon oxide layer. Alternatively, the substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. Other substrates, such as multi-layered or gradient substrates, may also be used.

In some embodiments, as shown in FIG. 1, the memory cell 124 includes a bottom electrode 126, a phase change layer 132, an interfacial conductive layer 134, a resistance variable layer 136, a top electrode 138, and a hard mask 140. In detail, along a direction Z, the bottom electrode 126, the phase change layer 132, the interfacial conductive layer 134, the resistance variable layer 136, the top electrode 138 and the hard mask 140 are sequentially stacked over the substrate 102. However, the disclosure is not limited thereto. In some alternative embodiments, the memory cell 124 may include the bottom electrode 126, the phase change layer 132, the interfacial conductive layer 134, the resistance variable layer 136 and the top electrode 138 without having the hard mask 140. From another point of view, since the memory cell 124 includes the phase change layer 132 and the resistance variable layer 136, the memory cell 124 can be regarded as comprising a phase change random access memory (PCRAM) unit and a resistive random access memory (RRAM) unit electrically coupled to each other in series. Further, in embodiments where the memory device 100 includes the semiconductor device 104, the memory cell 124 and the semiconductor device 104 are configured in a one transistor-one resistive memory cell (e.g., 1T1R) configuration. However, the disclosure is not limited thereto. In some alternative embodiments, the memory device 100 has a cross-point architecture, in which the semiconductor device (e.g., the semiconductor device 104 of FIG. 1) is omitted and a selector is included.

The bottom electrode 126 is embedded in the etch stop layer 120 and the dielectric layer 122. In some embodiments, as shown in FIG. 1, the bottom electrode 126 vertically extends through the etch stop layer 120 and the dielectric layer 122 from the phase change layer 132 to the conductive wire 116 directly underlying the etch stop layer 120. In other words, the etch stop layer 120 and the dielectric layer 122 laterally surround the bottom electrode 126. Further, the bottom electrode 126 is electrically connected with the underlying conductive wire 116 and the overlying phase change layer 132. In some embodiments, as shown in FIG. 1, the bottom electrode 126 includes a heat isolation layer 128 and a conductive structure 130. The heat isolation layer 128 laterally surrounds the conductive structure 130. In detail, as shown in FIG. 1, the heat isolation layer 128 covers a sidewall and a bottom surface of the conductive structure 130, such that the heat isolation layer 128 is directly in contact with the underlying etch stop layer 120. The top surface of the heat isolation layer 128 and the top surface of the conductive structure 130 collectively define the top surface of the bottom electrode 126 directly in contact with the overlying phase change layer 132. In some embodiments, the bottom electrode 126 may be configured as a heater structure that may heat the phase change layer 132 during operation of the memory cell 124. The heat isolation layer 128 is configured to block the joule heat produced by the conductive structure 130 from laterally leaking to surrounding components. The thermal conductivity of the material of the heat isolation layer 128 is smaller than the thermal conductivity of the material of the conductive structure 130. In some embodiments, the material of the heat isolation layer 128 includes Ti, TiN, Ta, TaN, a combination thereof, a multilayer thereof, or other suitable material; and the material of the conductive structure 130 includes a conductive material such as Ti, Co, W, Ru, Cu, AlCu, WN, TiN, TiW, TiAl, TiAlN, a combination thereof, a multilayer thereof, or other suitable material. For instance, the material of the heat isolation layer 128 includes TaN, which has a thermal conductivity of about 3 W/mK, whereas the material of the conductive structure 130 includes TiN, which has a thermal conductivity of about 20 W/mK. In some embodiments, the etch stop layer 120 and the dielectric layer 122 may be configured as insulator layers that may assist in dissipating heat generated by the conductive structure 130. As such, in some alternative embodiments, the bottom electrode 126 includes only the conductive structure 130 without having the heat isolation layer 128. In some embodiments, the thickness of the bottom electrode 126 ranges from about 30 nm to about 60 nm.

As crystallinity of the phase change layer 132 is altered, the phase change layer 132 is able to be switched between multiple resistance states. Accordingly, the phase change layer 132 can be configured to store multiple logic states. In certain embodiments, the phase change layer 132 is configured to store two logic states or two data states. When the phase change layer 132 has the highest crystallinity, the phase change layer 132 has the lowest resistance, and a low resistance state can be stored in the phase change layer 132; while when the phase change layer 132 has the amorphous film or lowest crystallinity, the phase change layer 132 has the highest resistance, and a high resistance state can be stored in the phase change layer 132. In embodiments where the phase change layer 132 is configured to store two logic states, the phase change layer 132 may be switched between the lowest resistance state and the highest resistance state. From another point of view, the crystallinity of the phase change layer 110 can be altered due to the joule heat generated by the conductive structure 130 of the bottom electrode 126. Since along a direction X perpendicular to the direction Z, the dimension W1 of the bottom electrode 136 is less than the dimension W2 of the phase change layer 132, only a portion of the phase change layer 132 is in contact with the bottom electrode 136. As such, only a region, which is close to or in contact with the conductive structure 130 of the bottom electrode 136, of the phase change layer 132 can be heated by the joule heat generated by the conductive structure 130. The said region of the phase change layer 132 is referred as an active region A, and the active region A may undergo a phase transition (i.e., change of crystallinity) while being heated by the conductive structure 130. Further, in some embodiments, the bottom electrode 126 has a footprint area smaller than a footprint area of the phase change layer 132.

The phase change layer 132 is made of a phase change material. In some embodiments, the phase change material is a chalcogenide material. In these embodiments, the chalcogenide material may include one or more of Ge, Te and Sb. For instance, the chalcogenide material may be GeSbTe, such as $Ge_2Sb_2Te_5$ (GST225), $Ge_4Sb_2Te_4$ (GST424) or so forth). In certain cases, the chalcogenide material may be doped with N, Si, C, In or Ga, and an example of such chalcogenide material may be doped $Ge_6Sb_1Te_2$ (GST612). In some embodiments, the thickness of the phase change layer 132 ranges from about 20 nm to about 40 nm. It is noted that those skilled in the art may select other suitable materials for forming the phase change layer 132, and/or may modify dimension of the phase change layer 132 according to process requirements, the present disclosure is not limited thereto. In some embodiments, when the phase change layer 132 is in the high resistance state, the phase change layer 132 presents a resistance value, which ranges between about 1000 kilo ohm and about 2000 kilo ohm; while when the phase change layer 132 is in the low resistance state, the phase change layer 132 presents a resistance value, which ranges between about 5 kilo ohm and about 15 kilo ohm.

As shown in FIG. 1, the interfacial conductive layer 134 is disposed between the phase change layer 132 and the resistance variable layer 136. In some embodiments, in the memory cell 124, the interfacial conductive layer 134 is configured to allow the resistance variable layer 136 being formed over the phase change layer 132. In some embodiments, the material of the interfacial conductive layer 134 includes titanium nitride (TiN), tantalum nitride (TaN), tungsten, Ti, Ta, Ru or carbon. In some embodiments, the thickness of the interfacial conductive layer 134 ranges from about 2 nm to about 4 nm.

Due to redox reactions, a filament or conductive path forms and dissolves in a region B of the resistance variable layer 136 between the top electrode 138 and the bottom electrode 126. When a conductive path penetrating through the resistance variable layer 136 is formed, the resistance variable layer 136 has the lowest resistance, and a low resistance state can be stored in the resistance variable layer 136; while when the conductive path is cut off or absent in the resistance variable layer 136, the resistance variable layer 136 has the highest resistance, and a high resistance state can be stored in the resistance variable layer 136. As such, the resistance variable layer 136 can be switched between the high resistance state and low resistance state by applying appropriate biases to the memory cell 122 to produce or dissolve the conductive path in the region B. In such embodiments, the resistance variable layer 136 is configured to store two logic states or two data states. In some embodiments, the top electrode 138 is configured to receive a programming voltage (e.g., a forming voltage, a set voltage, a reset voltage, etc.) and the bottom electrode 126 is configured to receive a reference voltage (e.g., a ground voltage, 0 volt, etc.), such that the voltage difference is created between the top electrode 138 and the bottom electrode 126 to induce redox reactions. In various embodiments, the memory cell 122 may be switched between the high resistance state and the low resistance state by applying the programming voltage to the top electrode 138 and the reference voltage to the bottom electrode 126. Since the interfacial conductive layer 134 is connected between the phase change layer 132 contacting with the bottom electrode 126 and the resistance variable layer 136, the resistance variable layer 136 away from the bottom electrode 126 still can be controlled by the voltage difference created between the top electrode 138 and the bottom electrode 126. In some embodiments, a filament or conductive path in the region B of the resistance variable layer 136 is formed of oxygen vacancies. However, it will be appreciated that the resistance variable layer 136 is not limited to having such path. In some alternative embodiments, a conductive path in the region B of the resistance variable layer 136 may be formed of conductive ions and not oxygen vacancies or may be formed of oxygen vacancies and conductive ions.

The resistance variable layer 136 is made of a material having a variable resistance configured to undergo a reversible phase change between a high resistance state and a low resistance. In some embodiments, the material of the resistance variable layer 136 is a transitional metal oxide. In these embodiments, the transitional metal oxide may include one or more of hafnium oxide (HfO$_x$), aluminum oxide (AlO$_x$), tantalum oxide (TaO$_x$), other composite combinations such as hafnium aluminum oxide (HfAlO), or silicon oxide (SiO$_2$), a high-k dielectric material, or other suitable material. In some embodiments, the thickness of the resistance variable layer 136 ranges from about 5 nm to about 10 nm. It is noted that those skilled in the art may select other suitable materials for forming the resistance variable layer 136, and/or may modify dimension of the resistance variable layer 136 according to process requirements, the present disclosure is not limited thereto. In some embodiments, when the resistance variable layer 136 is in the high resistance state, the resistance variable layer 136 presents a resistance value, which ranges between about 100 kilo ohm and about 300 kilo ohm; while when the resistance variable layer 136 is in the low resistance state, the resistance variable layer 136 presents a resistance value, which ranges between about 5 kilo ohm and about 15 kilo ohm. In some embodiments, a resistance value of the resistance variable layer 136 at the high resistance state is less than a resistance value of the phase change layer 132 at the high resistance state. In some embodiments, a highest resistance value of the resistance variable layer 136 is less than a highest resistance value of the phase change layer 132. In some embodiments, a resistance value of the resistance variable layer 136 at the low resistance state is substantially equal to a resistance value of the phase change layer 132 at the low resistance state. In some embodiments, a lowest resistance value of the resistance variable layer 136 is substantially equal to a lowest resistance value of the phase change layer 132.

In some embodiments, the top electrode 138 is or comprises titanium, tantalum, tungsten, hafnium, a nitride (such as titanium nitride), a combination of the foregoing, or other suitable material. In some embodiments, the top electrode 138 and the conductive structure 130 comprise the same material. In some alternative embodiments, the top electrode 138 and the conductive structure 130 may comprise different materials. In some embodiments, the thickness of the top electrode 138 ranges from about 10 nm to about 15 nm.

In some embodiments, the hard mask 140 is or comprises silicon carbide (SiC), silicon nitride (SiN), silicon oxynitride (SiON), or other suitable material. In some embodiments, the thickness of the hard mask 140 ranges from about 5 nm to about 30 nm.

Figure 12:
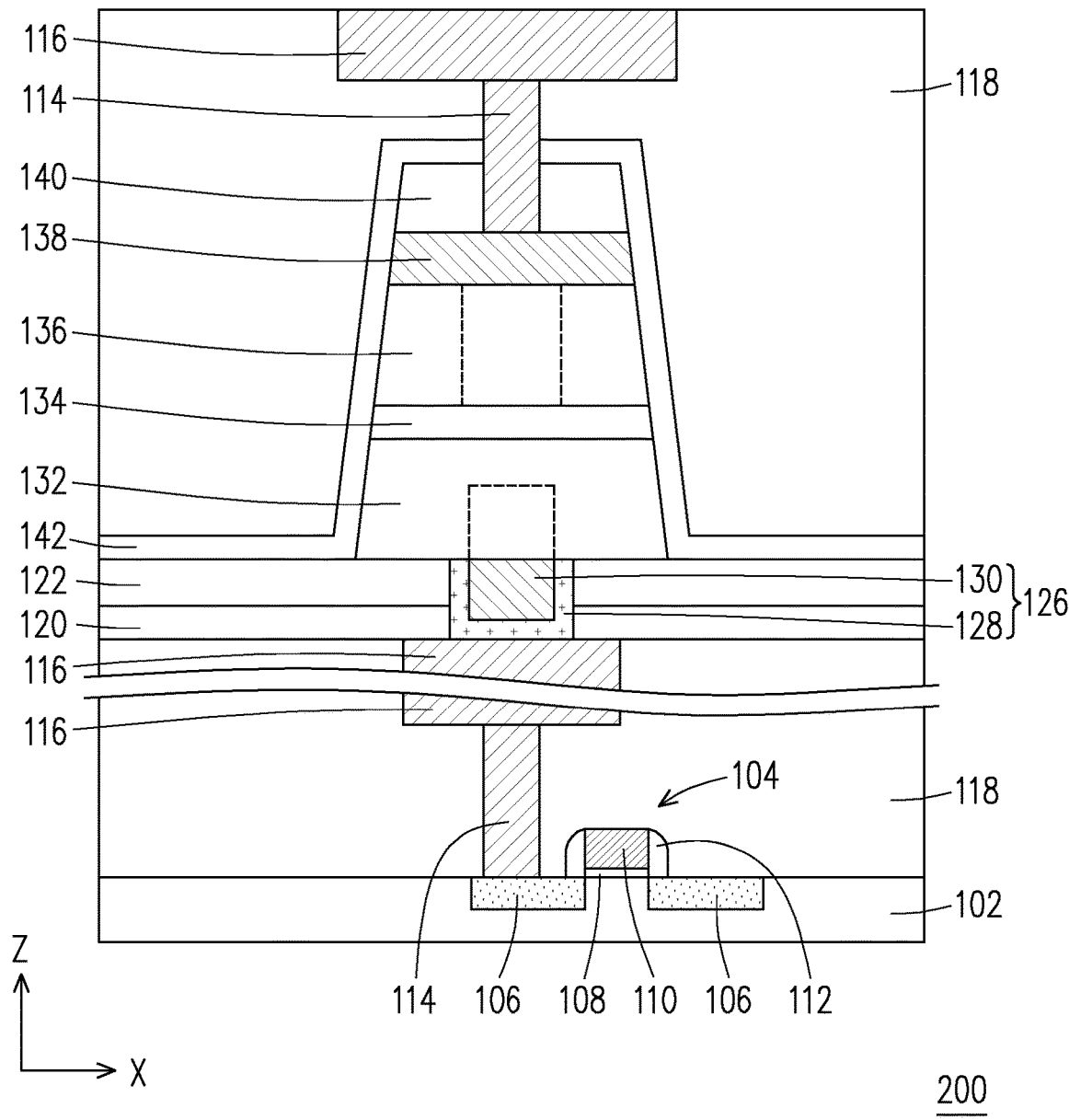
FIG. 12 is a schematic cross-sectional view illustrating a memory device according to some alternative embodiments of the present disclosure.

In some embodiments, as shown in FIG. 1, the sidewall of the phase change layer 132, the sidewall of the interfacial conductive layer 134, the sidewall of the resistance variable layer 136, the sidewall of the top electrode 138 and the sidewall of the hard mask 140 are substantially aligned with each other. However, the disclosure is not limited thereto. In some alternative embodiments, the sidewall of at least one of the phase change layer 132, the interfacial conductive layer 134, the resistance variable layer 136, the top electrode 138 and the hard mask 140 may be laterally recessed and concave from sidewalls of other of the phase change layer 132, the interfacial conductive layer 134, the resistance variable layer 136, the top electrode 138 and the hard mask 140. In some embodiments, as shown in FIG. 1, each of the sidewall of the phase change layer 132, the sidewall of the interfacial conductive layer 134, the sidewall of the resistance variable layer 136, the sidewall of the top electrode 138 and the sidewall of the hard mask 140 is a vertical sidewall along the direction Z. However, the disclosure is not limited thereto. In some alternative embodiments, referring to FIG. 12, in the memory device 200, each of the sidewall of the phase change layer 132, the sidewall of the interfacial conductive layer 134, the sidewall of the resistance variable layer 136, the sidewall of the top electrode 138 and the sidewall of the hard mask 140 is a slanted sidewall. In these embodiments, the lateral dimension along the direction X of each of the hard mask 140, the top electrode 138, the resistance variable layer 136, the interfacial conductive layer 134 and the phase change layer 132 gradually increases toward the underlying bottom electrode 126.

In some embodiments, the substrate 102 comprises a first doping type (e.g., p-type) and the source/drain regions 106 of the semiconductor device 104 comprises a second doping type (e.g., n-type) opposite the first doping type. In some embodiments, as shown in FIG. 1, the semiconductor device 104 is a planar-type metal-oxide-semiconductor field effect transistor (MOSFET). In these embodiments, the semiconductor device 104 is formed in and over a portion of the substrate 102 having a planar top surface. This portion of the substrate 102 may be referred as an active region of the semiconductor device 104. Further, in these embodiments, the source/drain regions 106 are disposed within the substrate 102 and laterally spaced apart from one another, the gate dielectric layer 108 overlies the substrate 102 between the source/drain regions 106, and the gate electrode 110 overlies the gate dielectric layer 108. The gate dielectric layer 108 of the semiconductor device 104 may, for example, be or comprise an oxide, such as silicon dioxide, a high-k dielectric material, or other suitable dielectric material. The gate electrode 110 of the semiconductor device 104 may, for example, be or comprise a metal material, such as aluminum, tungsten or titanium, polysilicon, or other suitable conductive material. Further, the sidewall spacer structure 112 of the semiconductor device 104 may, for example, be or comprise silicon nitride, silicon carbide, or other suitable material. In alternative embodiments, the semiconductor device 104 is a fin-type MOSFET (also referred as fin-FET). In these alternative embodiments, the semiconductor device 104 is formed in and over an active region shaped as a fin structure (not shown), and the gate electrode 110 may cover a sidewall and a top surface of the fin-shape active region. Furthermore, in some embodiments, the source/drain regions 106 may be replaced by epitaxial structures formed in recesses at a top portion of the active region. Those skilled in the art may modify structure, configuration and dimensions of the semiconductor device 104 according to design requirements, the present disclosure is not limited thereto.

In some embodiments, the interconnect dielectric structure 118 overlies the semiconductor device 104 and the memory cell 124. In some embodiments, the interconnect dielectric structure 118 may, for example, be or comprise one or more inter-level dielectric (ILD) layers. The one or more ILD layers may each, for example, be or comprise silicon dioxide, a low-k dielectric material, an extreme low-k dielectric material, or other suitable dielectric material. As used herein, the low-k dielectric material is a dielectric material with dielectric constant less than 3, and the extreme low-k dielectric material is a dielectric material with dielectric constant less than 2.

In some embodiments, some of the conductive vias 114 and some of the conductive wires 116 overlie the semiconductor device 104 and are electrically connected between the semiconductor device 104 and the bottom electrode 126 of the memory cell 124. In detail, as shown in FIG. 1, one of the conductive vias 114 vertically extends through the interconnect dielectric structure 118 to contact with the source/drain region 106. In some embodiments, one of the conductive vias 114 and one of the conductive wires 116 overlie the top electrode 138 and are electrically connected with the top electrode 138. In detail, as shown in FIG. 1, the conductive via 114 vertically extends through the interconnect dielectric structure 118, the passivation layer 142 and the hard mask 140 to contact with the top electrode 138. In some embodiments, the conductive via 114 and the conductive wire 116 may, for example, each be or comprise aluminum, titanium, copper, tungsten, or other suitable conductive material.

In some embodiments, the passivation layer 142 extends continuously from the top surface of the hard mask 140 to the top surface of the dielectric layer 122. In some embodiments, the passivation layer 142 continuously is in contact with the sidewalls of the phase change layer 132, the interfacial conductive layer 134, the resistance variable layer 136, the top electrode 138 and the hard mask 140. That is to say, in some embodiments, the passivation layer 142 laterally encloses the phase change layer 132, the interfacial conductive layer 134, the resistance variable layer 136, the top electrode 138 and the hard mask 140. In some embodiments, as shown in FIG. 1, the passivation layer 142 covers the top surface of the dielectric layer 122 which does not be covered by the phase change layer 132. However, the disclosure is not limited thereto. In some alternative embodiments, the passivation layer 142 only covers a portion of the top surface of the dielectric layer 122 which does not be covered by the phase change layer 132. In some embodiments, the passivation layer 142 is or comprises silicon nitride, silicon oxide, silicon carbide, or other suitable material. In some embodiments, the thickness of the passivation layer 142 ranges from about 1 nm to about 10 nm.

Figure 2:
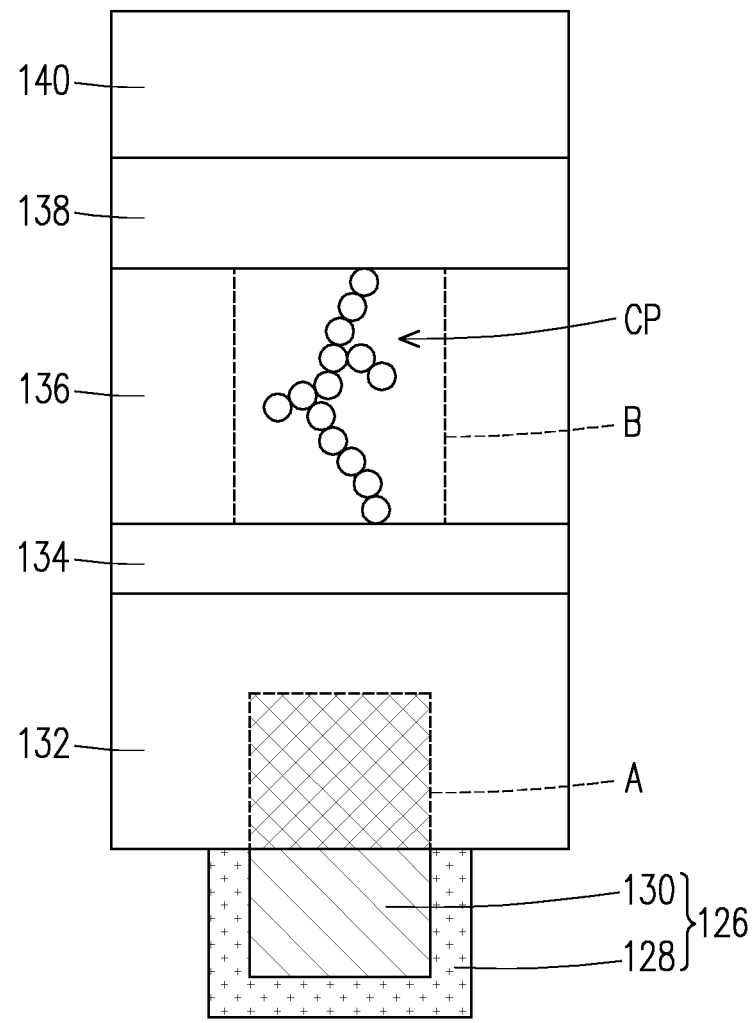
FIGS. 2-4 are schematic cross-sectional views illustrating different states of the memory cell according to some embodiments of the present disclosure.
Figure 3:
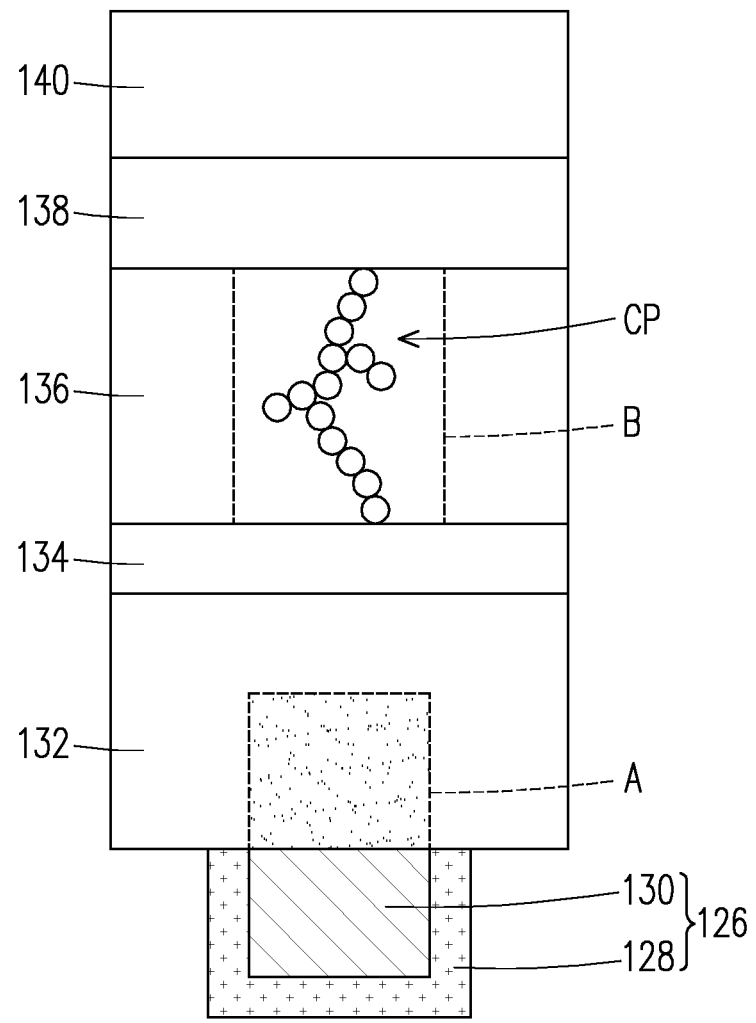
Figure 4:
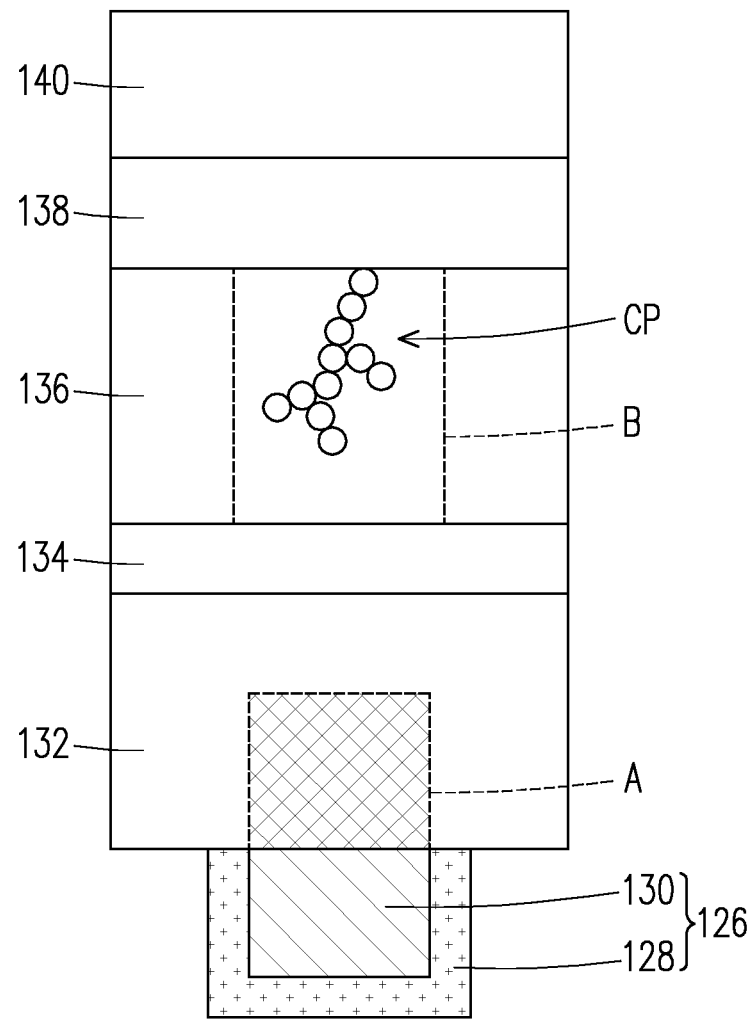
Figure 5:
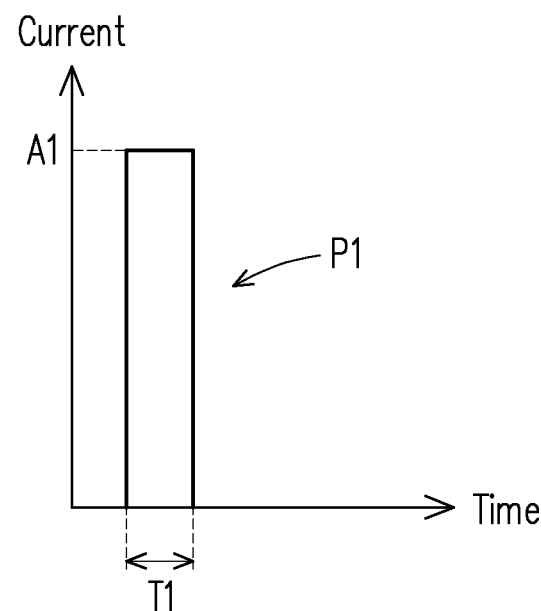
FIG. 5 and FIG. 6 are schematic diagrams illustrating waveforms of input currents provided to the memory cell according to some embodiments of the present disclosure.
Figure 6:
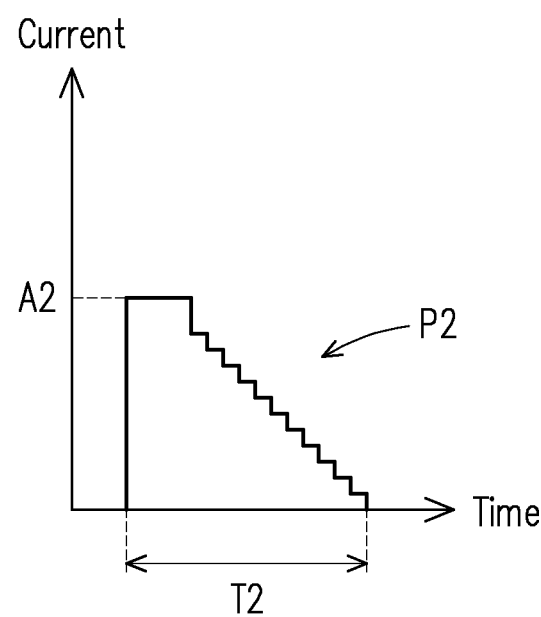
Figure 7:
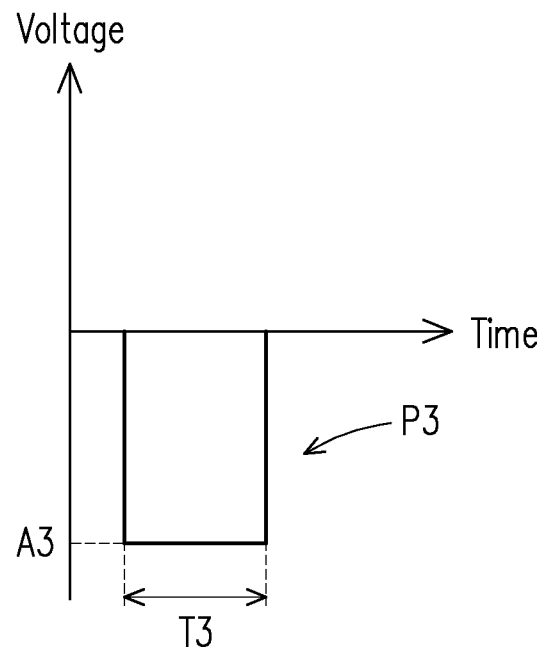
FIG. 7 and FIG. 8 are schematic diagrams illustrating waveforms of input voltages provided to the memory cell according to some embodiments of the present disclosure.
Figure 8:
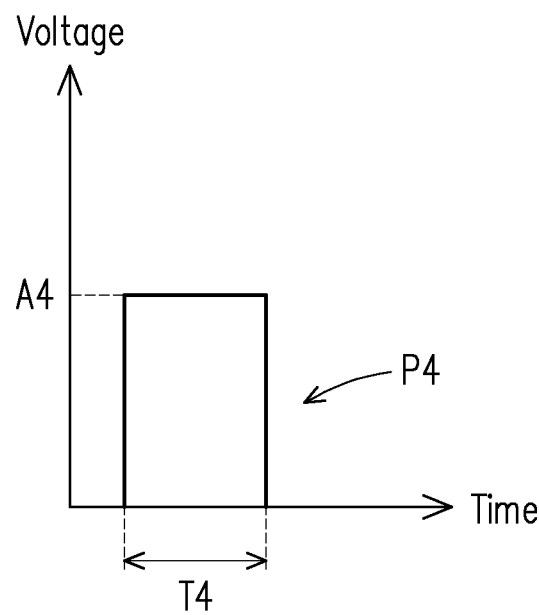

Since the memory cell 124 includes the phase change layer 132 and the resistance variable layer 136 which both are data storage layers configured to store at least two logic states, the memory device 100 can be used for multi-level programming. In some embodiments, 3 level programming can be achieved by using the memory device 100. Hereinafter, one type of 3 level programming achieved by using the memory device 100 will be described in details with reference to FIG. 2 to FIG. 8. FIGS. 2-4 are schematic cross-sectional views illustrating different states of the memory cell according to some embodiments of the present disclosure. FIG. 5 and FIG. 6 are schematic diagrams illustrating waveforms of input currents provided to the memory cell according to some embodiments of the present disclosure. FIG. 7 and FIG. 8 are schematic diagrams illustrating waveforms of input voltages provided to the memory cell according to some embodiments of the present disclosure.

Referring to FIG. 2, in the first resistance state RS1, the conductive path CP penetrating continuously through the resistance variable layer 136 is formed in the region B, and the active region A of the phase change layer 132 is in a crystalline phase. As such, in the first resistance state RS1, the phase change layer 132 and the resistance variable layer 136 both are in the low resistance states. In certain embodiments, in the first resistance state RS1, the resistance value of the phase change layer 132 is about 10 kilo ohm, and the resistance value of the resistance variable layer 136 is about 10 kilo ohm.

Referring to FIG. 3, in the second resistance state RS2, the conductive path CP penetrating continuously through the resistance variable layer 136 is formed in the region B, and the active region A of the phase change layer 132 is in an amorphous phase. As such, in the second resistance state RS2, the phase change layer 132 is in the high resistance state, and the resistance variable layer 136 is in the low resistance state. From another point of view, the total resistance value of the phase change layer 132 and the resistance variable layer 136 in the second resistance state RS2 is greater than the total resistance value of the phase change layer 132 and the resistance variable layer 136 in the first resistance state RS1. In certain embodiments, in the second resistance state RS2, the resistance value of the phase change layer 132 is about 1000 kilo ohm, and the resistance value of the resistance variable layer 136 is about 10 kilo ohm.

Referring to FIG. 4, in the third resistance state RS3, the conductive path CP formed in the region B of the resistance variable layer 136 is cut off without extending continuously from the top electrode 138 to the interfacial conductive layer 134, and the active region A of the phase change layer 132 is in a crystalline phase. As such, in the third resistance state RS3, the phase change layer 132 is in the low resistance state, and the resistance variable layer 136 is in the high resistance state. From another point of view, the total resistance value of the phase change layer 132 and the resistance variable layer 136 in the third resistance state RS3 is greater than the total resistance value of the phase change layer 132 and the resistance variable layer 136 in the first resistance state RS1. Further, in some embodiments, the total resistance value of the phase change layer 132 and the resistance variable layer 136 in the third resistance state RS3 is less than the total resistance value of the phase change layer 132 and the resistance variable layer 136 in the second resistance state RS2. In this way, the first resistance state RS1, the second resistance state RS2 and the third resistance state RS3 are three different resistance states. In certain embodiments, in the third resistance state RS3, the resistance value of the phase change layer 132 is about 10 kilo ohm, and the resistance value of the resistance variable layer 136 is about 100 kilo ohm.

Since the resistance variable layer 136 in the first resistance state RS1 and the resistance variable layer 136 in the second resistance state RS2 both are in the low resistance states without transition, the programming operation performed between the first resistance state RS1 and the second resistance state RS2 can be regarded as the programming operation of PCRAM unit. In detail, during the transition from the first resistance state RS1 to the second resistance state RS2, in order to turn the active region A of the phase change layer 132 from the crystalline phase into the amorphous phase, a current pulse P1 shown in FIG. 5 may be provided to the bottom electrode 126. The amplitude A1 of the current pulse P1 is high enough that the joule heat provided to the phase change layer 132 by the conductive structure 130 of the bottom electrode 126 is able to substantially melt the phase change material at the active region A of the phase change layer 132. In addition, the duration time T1 of the current pulse P1 is short enough that the melted phase change material at the active region A can be quenched to form the amorphous phase. In some embodiments, as shown in FIG. 5, the current pulse P1 is provided with a sharp/abrupt rising edge and a sharp/abrupt falling edge. For instance, the current pulse P1 may be a rectangular current pulse. In some embodiments, the amplitude A1 of the current pulse P1 ranges from about 150 μA to about 300 μA. In some embodiments, the duration time T1 of the current pulse P1 ranges from about 5 ns to about 20 ns. In certain embodiments, the amplitude A1 of the current pulse P1 is about 150 μA and the duration time T1 of the current pulse P1 is about 10 ns. Those skilled in the art may adjust the amplitude A1, the duration time T1 and other characteristics of the current pulse P1 according to the materials of the bottom electrode 126 and the phase change layer 132 or other process conditions, the present disclosure is not limited thereto. Moreover, the shape and the volume of the active region A of the phase change layer 132 may be altered along with adjustment of the current pulse P1 and/or selection of the materials of the bottom electrode 126 and the phase change layer 132, the present disclosure is not limited thereto as well. In some embodiments, the programming operation for the transition from the first resistance state RS1 to the second resistance state RS2 is a reset programming operation of PCRAM unit.

Furthermore, during the transition from the second resistance state RS2 to the first resistance state RS1, in order to re-crystallize the phase change material at the active region A of the phase change layer 132, a current pulse P2 shown in FIG. 6 may be provided to the bottom electrode 126. The amplitude A2 of the current pulse P2 should be high enough that the joule heat provided to the phase change layer 132 by the conductive structure 130 of the bottom electrode 126 is able to re-crystallize the phase change material at the active region A. In addition, the amplitude A2 of the current pulse P2 should not be too high to result in melting of the phase change material at the active region A. As a result, the amplitude A2 of the current pulse P2 should be lower than the amplitude A1 of the current pulse P1. Moreover, the duration time T2 of the current pulse P2 should be long enough not to result in quenching of the crystallized phase change material at the active region A, so as to avoid from accidentally turning the active region A into the amorphous phase. In this way, the duration time T2 of the current pulse P2 should be longer than the duration time T1 of the current pulse P1. In some embodiments, as shown in FIG. 6, the current pulse P2 has a stair-down falling edge (i.e., a stepwise descending edge), in order to reduce the cooling rate of the active region A in the phase change layer 132. On the other hand, as similar to the current pulse P1, the current pulse P2 may have a sharp/abrupt rising edge as well, as shown in FIG. 6. However, those skilled in the art may adjust the amplitude A2, the duration time T2, the shape and/or other characteristics of the current pulse P2 according to materials of the bottom electrode 126 and the phase change layer 132 or other process conditions, as long as the phase change material at the active region A is ensured to be crystallized. In some embodiments, the amplitude A2 of the current pulse P2 ranges from about 100 μA to about 200 μA. In some embodiments, the duration time T2 of the current pulse P2 ranges from about 100 ns to about 300 ns. In certain embodiments, the amplitude A2 of the current pulse P2 is about 100 μA and the duration time T2 of the current pulse P2 is about 100 ns. In some embodiments, the programming operation for the transition from the second resistance state RS2 to the first resistance state RS1 is a set programming operation of PCRAM unit.

Moreover, since the phase change layer 132 in the first resistance state RS1 and the phase change layer 132 in the third resistance state RS3 both are in the low resistance states without transition, the programming operation performed between the first resistance state RS1 and the third resistance state RS3 can be regarded as the programming operation of RRAM unit. In detail, during the transition from the first resistance state RS1 to the third resistance state RS3, in order to cut off the conductive path CP formed in the region B, a negative voltage pulse P3 shown in FIG. 7 may be provided to the top electrode 138 to from the negative voltage difference between the top electrode 138 and the bottom electrode 126. The duration time T3 of the negative voltage pulse P3 should be long enough and/or the amplitude A3 of the negative voltage pulse P3 should not be too high not to result in quenching of the crystallized phase change material at the active region A, so as to avoid from accidentally turning the active regions A of the phase change layer 132 into the amorphous state during the transition from the first resistance state RS1 to the third resistance state RS3.

As such, in some embodiments, the duration time T3 of the negative voltage pulse P3 should be longer than the duration time T of the current pulse P1, and/or the amplitude of the current pulse generated by the negative voltage difference between the top electrode 138 and the bottom electrode 126 should be lower than the amplitude A1 of the current pulse P1. In embodiments where the amplitude A1 of the current pulse P1 is about 150 μA and the duration time T1 of the current pulse P1 is about 10 ns, the amplitude A3 of the negative voltage pulse P3 is about 1 V and the duration time T3 of the negative voltage pulse P3 is about 50 ns. In some embodiments, the amplitude A3 of the negative voltage pulse P3 ranges from about 1 V to about 1.5 V. In some embodiments, the duration time T3 of the negative voltage pulse P3 ranges from about 20 ns to about 80 ns. In some embodiments, as shown in FIG. 7, the negative voltage pulse P3 is a rectangular voltage pulse. However, those skilled in the art may adjust the amplitude A3, the duration time T3, the shape and/or other characteristics of the negative voltage pulse P3 according to material of the resistance variable layer 136 or other process conditions, as long as the conductive path CP formed in the region B is ensured to be cut off. In some embodiments, the programming operation for the transition from the first resistance state RS1 to the third resistance state RS3 is a reset programming operation of RRAM unit.

Further, during the transition from the third resistance state RS3 to the first resistance state RS1, in order to forming the conductive path CP extending continuously from the top electrode 138 to the interfacial conductive layer 134 in the region B of the resistance variable layer 136, a positive voltage pulse P4 shown in FIG. 8 may be provided to the top electrode 138 to from the positive voltage difference between the top electrode 138 and the bottom electrode 126. The polarity of the positive voltage pulse P4 is opposite to the polarity of the negative voltage pulse P3, while the amplitude A4 of the positive voltage pulse P4 is substantially equal to the amplitude A3 of the negative voltage pulse P3, and the duration time T4 of the positive voltage pulse P4 is substantially equal to the duration time T3 of the negative voltage pulse P3. As a result, during the transition from the third resistance state RS3 to the first resistance state RS1, the active region A of the phase change layer 132 is avoided from accidentally turning into the amorphous state. In embodiments where the amplitude A1 of the current pulse P1 is about 150 μA and the duration time T1 of the current pulse P1 is about 10 ns, the amplitude A4 of the positive voltage pulse P4 is about 1 V and the duration time T4 of the positive voltage pulse P4 is about 50 ns. In some embodiments, the amplitude A4 of the positive voltage pulse P4 ranges from about 1 V to about 1.5 V. In some embodiments, the duration time T4 of the positive voltage pulse P4 ranges from about 20 ns to about 80 ns. In some embodiments, as shown in FIG. 8, the positive voltage pulse P4 is a rectangular voltage pulse. However, those skilled in the art may adjust the amplitude A4, the duration time T4, the shape and/or other characteristics of the positive voltage pulse P4 according to material of the resistance variable layer 136 or other process conditions, as long as the conductive path CP formed in the region B is ensured to penetrate through the resistance variable layer 136. In some embodiments, the programming operation for the transition from the third resistance state RS3 to the first resistance state RS1 is a set programming operation of RRAM unit.

As shown in FIG. 2 and FIG. 4, whole of the phase change material at the active region A of the phase change layer 132 is crystallized, which means the phase change layer 132 in the first resistance state RS1 or the third resistance state RS3 is in the lowest resistance states. Similarly, as shown in FIG. 3, whole of the phase change material at the active region A of the phase change layer 132 is amorphous, which means the phase change layer 132 in the second resistance state RS2 is in the highest resistance states. As mentioned above, the resistance value of the phase change layer 132 is altered due to the crystallinity of the phase change layer 132. Accordingly, in embodiments where at least one intermediate resistance state can exist between the most crystallized state (e.g., the lowest resistance state as shown in FIG. 2 or FIG. 4) and the most amorphous state (e.g., the highest resistance state as shown in FIG. 3) of the phase change layer 132, a multi-level programming which more than 3 level can be performed by using the memory device 100. In such embodiments, the resistance value of the at least one intermediate resistance state of the phase change layer 132 is greater than the resistance value of the high resistance state of the resistance variable layer 136.

Figure 9:
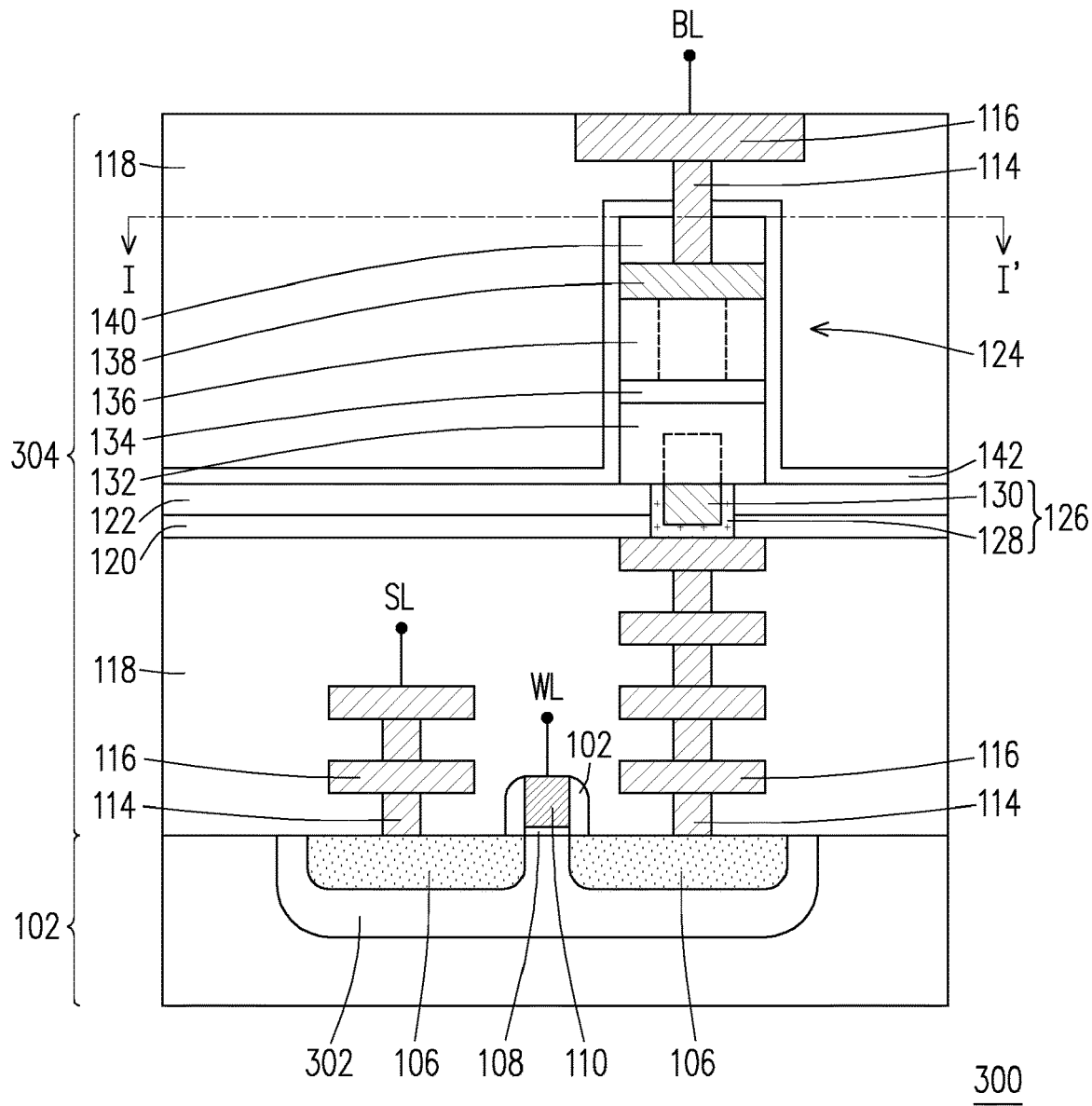
FIG. 9 is a schematic cross-sectional view illustrating an integrated circuit (IC) with a memory cell according to some embodiments of the present disclosure.
Figure 10:
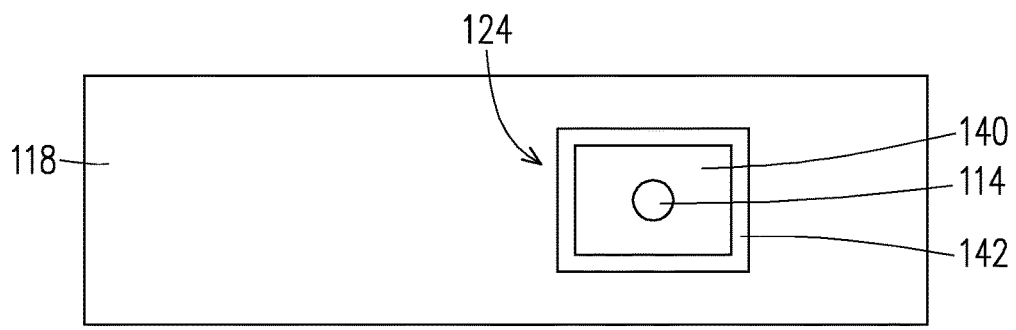
FIG. 10 is a schematic plan view illustrating the IC of FIG. 9.

FIG. 9 is a schematic cross-sectional view illustrating an integrated circuit (IC) 300 with the memory cell 124 according to some embodiments of the present disclosure. FIG. 10 is a schematic plan view illustrating the IC 300 of FIG. 9. The schematic plan view of FIG. 10 is taken along the lines I-I' shown in FIG. 9.

The IC 300 includes an interconnect structure 304 overlying the substrate 102. In some embodiments, as shown in FIG. 9, a well region 302 is disposed within the substrate 102. In some embodiments, the substrate 102 comprises the first doping type (e.g., p-type), and the well region 302 comprises the first doping type (e.g., p-type) with a higher doping concentration than the substrate 102. Further, as shown in FIG. 9, the source/drain regions 106 of the semiconductor device 104 are disposed within the well region 302.

In some embodiments, the interconnect structure 304 includes the plurality of conductive vias 114, the plurality of conductive wires 116, and the interconnect dielectric structure 118. The interconnect structure 304 is configured to electrically couple the semiconductor device 104 to the memory cell 124 and/or another semiconductor device (not shown). The memory cell 124 is disposed within the interconnect structure 304 between the conductive wires 116, such that the interconnect dielectric structure 118 laterally surrounds the memory cell 124. In some embodiments, one of the source/drain regions 106 of the semiconductor device 104 is electrically coupled with a source line (SL), and another one of the source/drain regions 106 of the semiconductor device 104 is electrically coupled with a bit line (BL). In detail, as shown in FIG. 9, the source line is electrically coupled with the corresponding source/drain region 106 by way of the conductive vias 114 and the conductive wires 116, and the bit line is electrically coupled with the corresponding source/drain region 106 by way of the conductive vias 114, the conductive wires 116, and the memory cell 124. In some embodiments, the gate electrode 110 of the semiconductor device 104 is electrically coupled with a word line (WL), such that an appropriate WL voltage can be applied to the gate electrode 110 to electrically couple the memory cell 124 to the source line and/or the bit line. Thus, in some embodiments, an output of the bit line and/or the memory cell 124 may be accessed at the source line upon application of an appropriate WL voltage to the word line.

In some embodiments, as shown in the plan view of FIG. 10, the memory cell 124 and/or the hard mask 140 each have a rectangular shape or a square shape. However, the disclosure is not limited thereto. In some alternative embodiments, the memory cell 124 may have a circular shape, an elliptical shape or any suitable shape. Further, in some embodiments, as shown in the plan view of FIG. 10, the conductive via 114 has a circular shape. However, the disclosure is not limited thereto. In some alternative embodiments, the conductive via 114 may have a polygonal shape, an elliptical shape or any suitable shape.

FIG. 11A to FIG. 11J are schematic cross-sectional views 400-1300 illustrating a manufacturing process of a memory device having a memory cell according to some embodiments of the disclosure. Although the schematic cross-sectional views 400-1300 shown in FIGS. 11A-11J are described with reference to a method, it will be appreciated that the structures shown in FIGS. 11A-11J are not limited to the method but rather may stand alone separate of the method. Although FIGS. 11A-11J are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 11A:
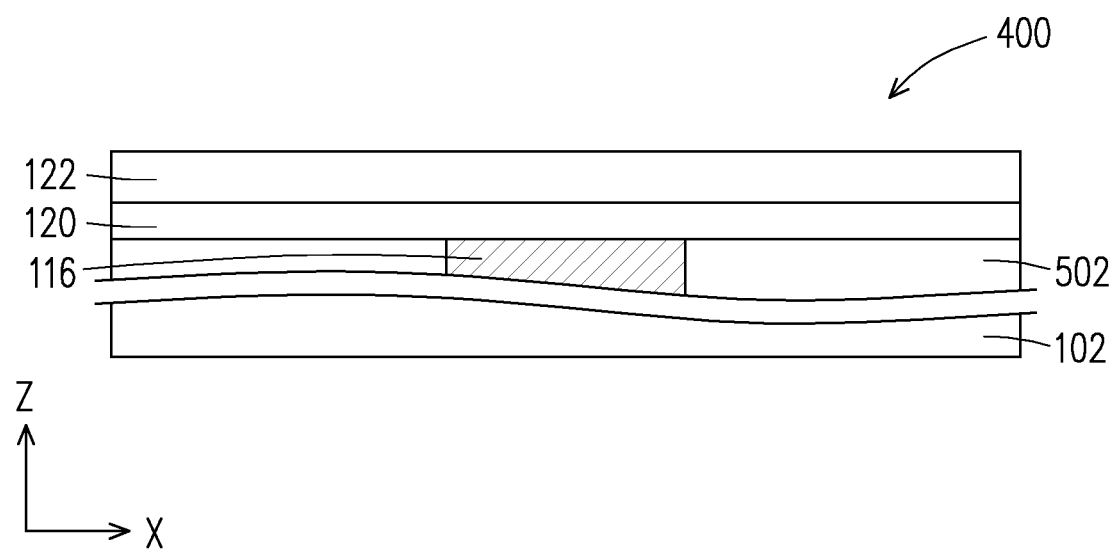
FIG. 11A to FIG. 11J are schematic cross-sectional views illustrating a manufacturing process of a memory device having a memory cell according to some embodiments of the disclosure.

As shown in the schematic cross-sectional view 400 of FIG. 11A, a lower inter-level dielectric (ILD) structure 502 is formed over the substrate 102 and the conductive wire 116 is formed within the lower ILD structure 502. In some embodiments, the lower ILD structure 502 is formed by chemical vapor deposition (CVD), physical vapor deposition (PVD), atomic layer deposition (ALD), or other suitable deposition process. In some embodiments, the conductive wire 116 is formed by a single damascene process or a dual damascene process.

Continue referring to the schematic cross-sectional view 400 of FIG. 11A, after forming the conductive wire 116, the etch stop layer 120 and the dielectric layer 122 are sequentially formed over the lower ILD structure 502. That is to say, the etch stop layer 120 is disposed between the lower ILD structure 502 and the dielectric layer 122, and the etch stop layer 120 is in contact with the conductive wire 116 and the lower ILD structure 502. In some embodiments, the etch stop layer 120 includes SiC, SiN, SiON, $HfO_x$, $ZrO_x$, $LaO_x$, or a combination thereof. In some embodiments, the etch stop layer 120 is formed by CVD, PVD, ALD or other suitable deposition process. In some embodiments, the dielectric layer 122 is made of a dielectric material, such as silicon oxide, silicon nitride, silicon oxynitride, a spin-on dielectric material, or a low-k dielectric material. In some embodiments, the dielectric layer 122 is formed by CVD, PVD, ALD or other suitable deposition process. In addition, the dielectric layer 122 has sufficient etching selectivity with respect to the underlying etch stop layer 120.

Figure 11B:
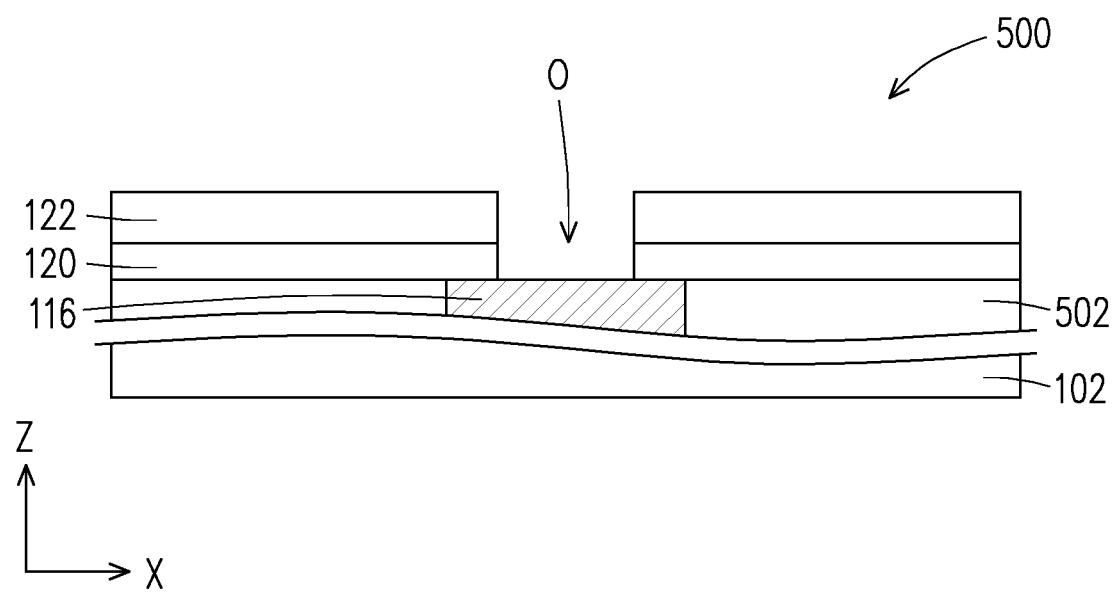

As shown in the schematic cross-sectional view 500 of FIG. 11B, portions of the dielectric layer 122 and the etch stop layer 120 are removed to form an opening O revealing the top surface of the underlying conductive wire 116. In some embodiments, the opening O in the dielectric layer 122 and the etch stop layer 120 is formed by multiple etching processes. In detail, the dielectric layer 122 is etched followed by etching the etch stop layer 120. Since the dielectric layer 122 has sufficient etching selectivity with respect to the underlying etch stop layer 120, during the etching process for the dielectric layer 122, this etching process is stopped at the etch stop layer 120. As such, the etch stop layer 120 is used to prevent the underlying conductive wire 116 from damage caused by the over-etching of the dielectric layer 122. In some embodiments, the etching processes used for forming the opening O each are an anisotropic etching process.

Figure 11C:
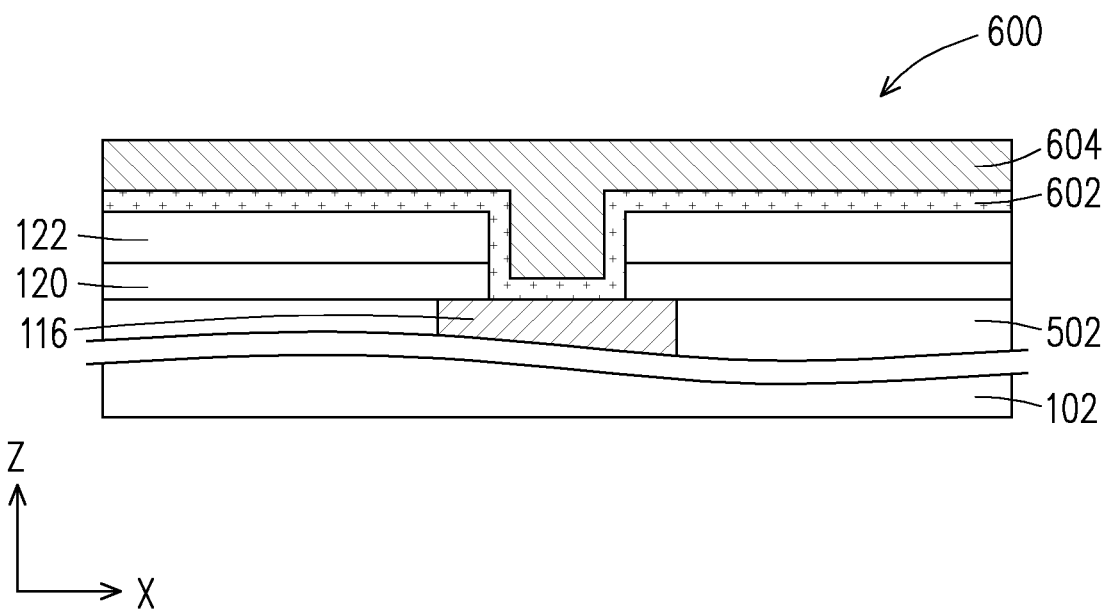

As shown in the schematic cross-sectional view 600 of FIG. 11C, after forming the opening O, a heat isolation material layer 602 is formed over the conductive wire 116 and the dielectric layer 122, such that the heat isolation material layer 602 at least partially lines the opening O. That is to say, the heat isolation material layer 602 extends into the opening O and is in contact with the exposed top surface of the underlying conductive wire 116. Then, after forming the heat isolation material layer 602, a conductive layer 604 is formed over the heat isolation material layer 602. In detail, as shown in FIG. 11C, the conductive layer 604 fills the remaining portion of the opening O. In some embodiments, each of the heat isolation material layer 602 and the conductive layer 604 is formed by CVD, PVD, ALD, electroless plating, electroplating, sputtering, or other suitable deposition or growth process.

Figure 11D:
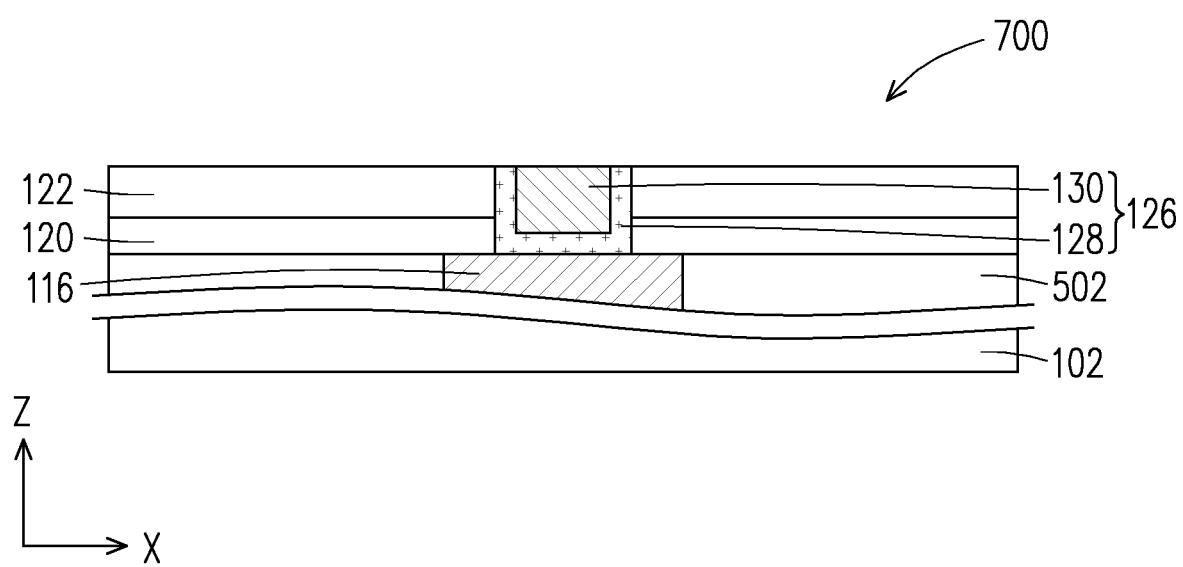

As shown in the schematic cross-sectional view 700 of FIG. 11D, a planarization process is performed on the heat isolation material layer 602 and the conductive layer 604 until the top surface of the dielectric layer 122 is exposed, thereby defining the heat isolation layer 128 and the conducive structure 130 of the bottom electrode 126. In some embodiments, the planarization process may include performing a chemical mechanical planarization (CMP) process.

Figure 11E:
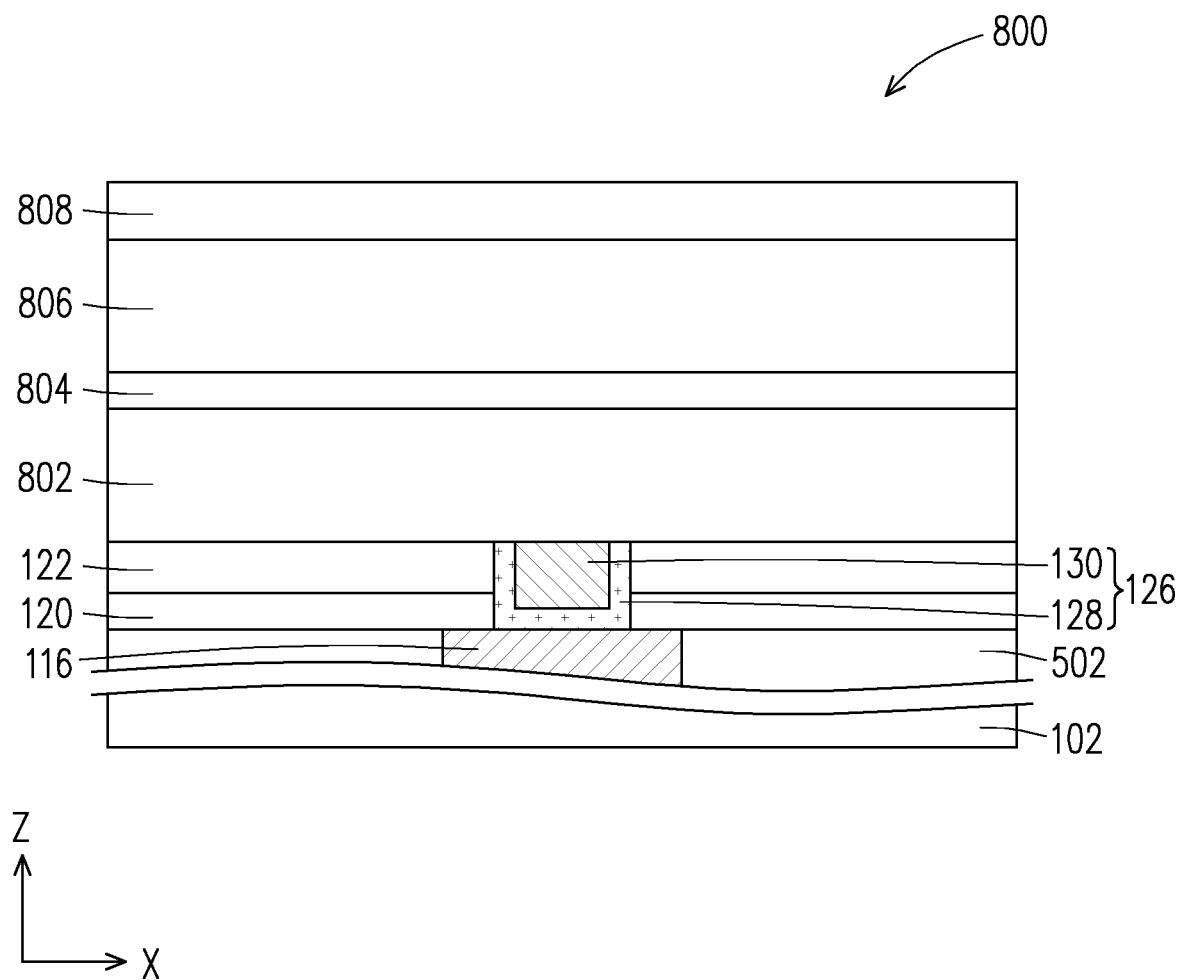

As shown in the schematic cross-sectional view 800 of FIG. 11E, after forming the bottom electrode 126, a phase change material layer 802, a conductive layer 804, a resistance variable material layer 806, and a conductive layer 808 are sequentially formed over the bottom electrode 126 and the dielectric layer 122. In some embodiments, the phase change material layer 802 is blanket deposited over the bottom electrode 126 and the dielectric layer 122. In some embodiments, the phase change material layer 802 is formed by PVD, ALD, CVD, plasma enhanced chemical vapor deposition (PECVD), a combination thereof, or other suitable deposition process. In some embodiments, the conductive layer 804 is blanket deposited over the phase change material layer 802. In some embodiments, the conductive layer 804 is formed by CVD, ALD, PVD, sputtering, electroless plating, electroplating, a combination thereof, or other suitable deposition or growth process. In some embodiments, the resistance variable material layer 806 is blanket deposited over the conductive layer 804. In some embodiments, the resistance variable material layer 806 is formed by CVD, ALD, PVD, a combination thereof, or other suitable deposition process. In some embodiments, the conductive layer 808 is blanket deposited over the resistance variable material layer 806. In some embodiments, the conductive layer 808 is formed by CVD, ALD, PVD, sputtering, electroless plating, electroplating, a combination thereof, or other suitable deposition or growth process.

Figure 11F:
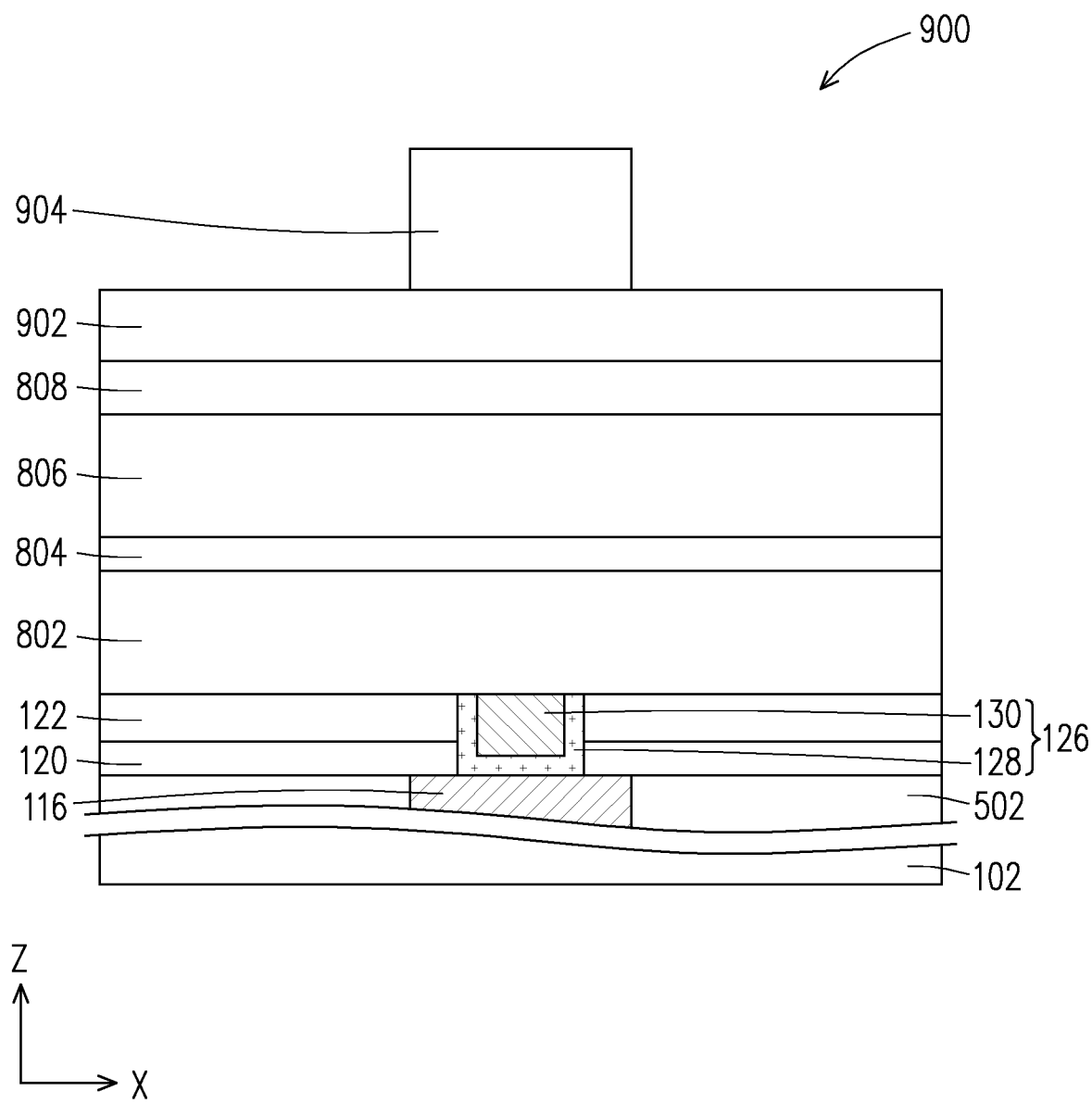
Figure 11G:
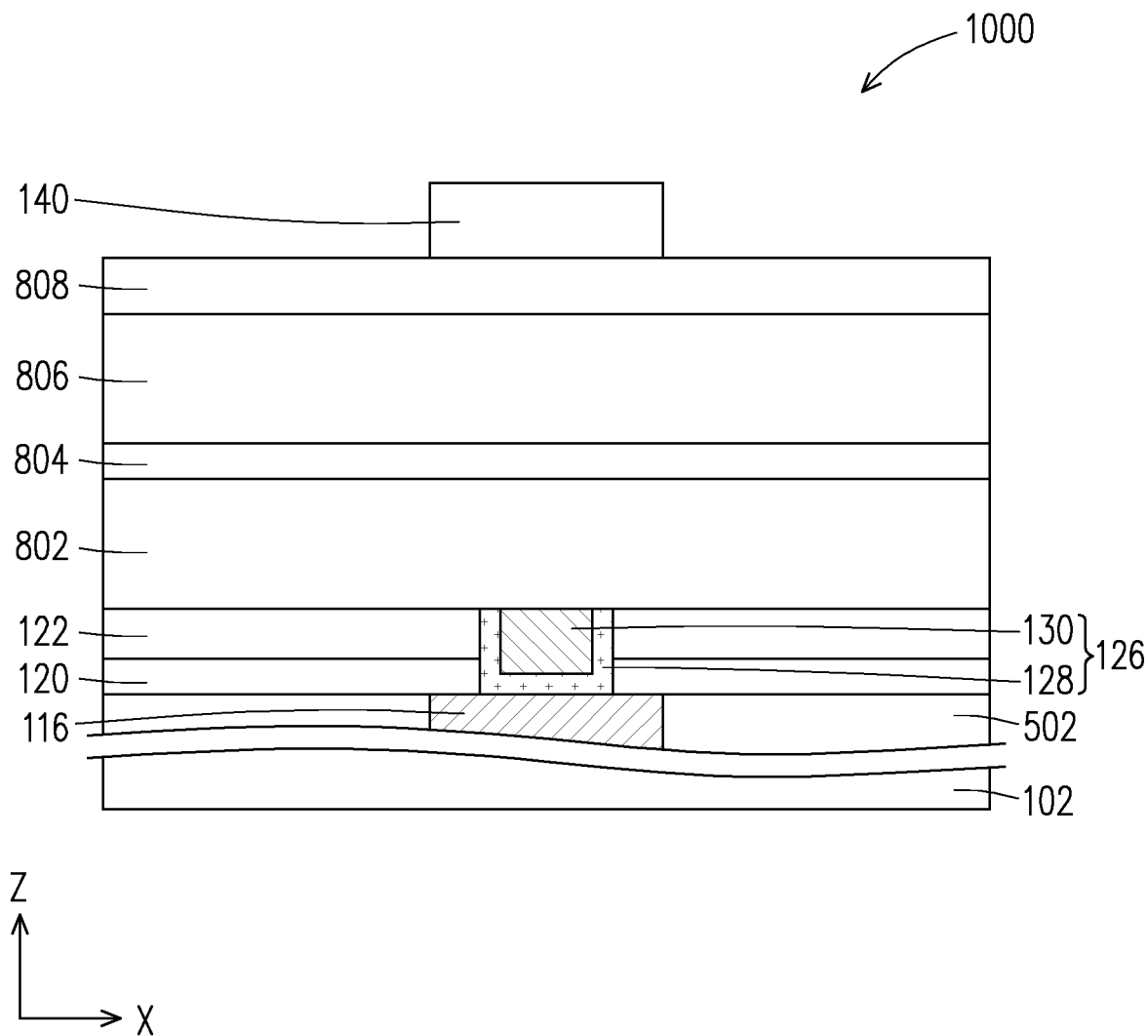

As shown in the schematic cross-sectional view 900 of FIG. 11F, a hard mask layer 902 and a photoresist pattern 904 are sequentially formed over the conductive layer 808. In some embodiments, the hard mask layer 902 is blanket deposited over the conductive layer 808. In some embodiments, the hard mask layer 902 is formed by CVD, ALD, PVD, a combination thereof, or other suitable deposition process. Further, the photoresist pattern 904 defines location, dimension and shape of the hard mask 140 (as shown in FIG. 11G) to be formed in the following step. The photoresist pattern 904 may be made of a photosensitive material, and may have a thickness ranging from about 500 Å to about 2000 Å. In addition, the formation method for the photoresist pattern 904 may include a solution process (e.g., a spin coating process) and a photolithography process.

As will be described with reference to FIG. 11G through FIG. 11H, in some embodiments, the hard mask layer 902, the conductive layer 808, the resistance variable material layer 806, the conductive layer 804 and the phase change material layer 802 are patterned by multiple steps.

As shown in the schematic cross-sectional view 1000 of FIG. 11G, the hard mask layer 902 is patterned to form the hard mask 140 by using the photoresist pattern 904 as a patterning mask. The hard mask 140 stands on the conductive layer 808, and is further applied as a patterning mask for patterning the underlying conductive layer 808, resistance variable material layer 806, conductive layer 804 and phase change material layer 802 in the following step (as shown in FIG. 11H). In some embodiments, the patterning process for forming the hard mask 140 includes an etching process. In some embodiments, the patterning process for forming the hard mask 140 includes an anisotropic etching process. In addition, the hard mask 140 may have sufficient etching selectivity with respect to the underlying conductive layer 808, and the conductive layer 808 may be functioned as an etching stop layer during the formation of the hard mask 140. In some embodiments, after forming the hard mask 140, the photoresist pattern 904 is removed by, for example, an ashing process or a stripping process.

Figure 11H:
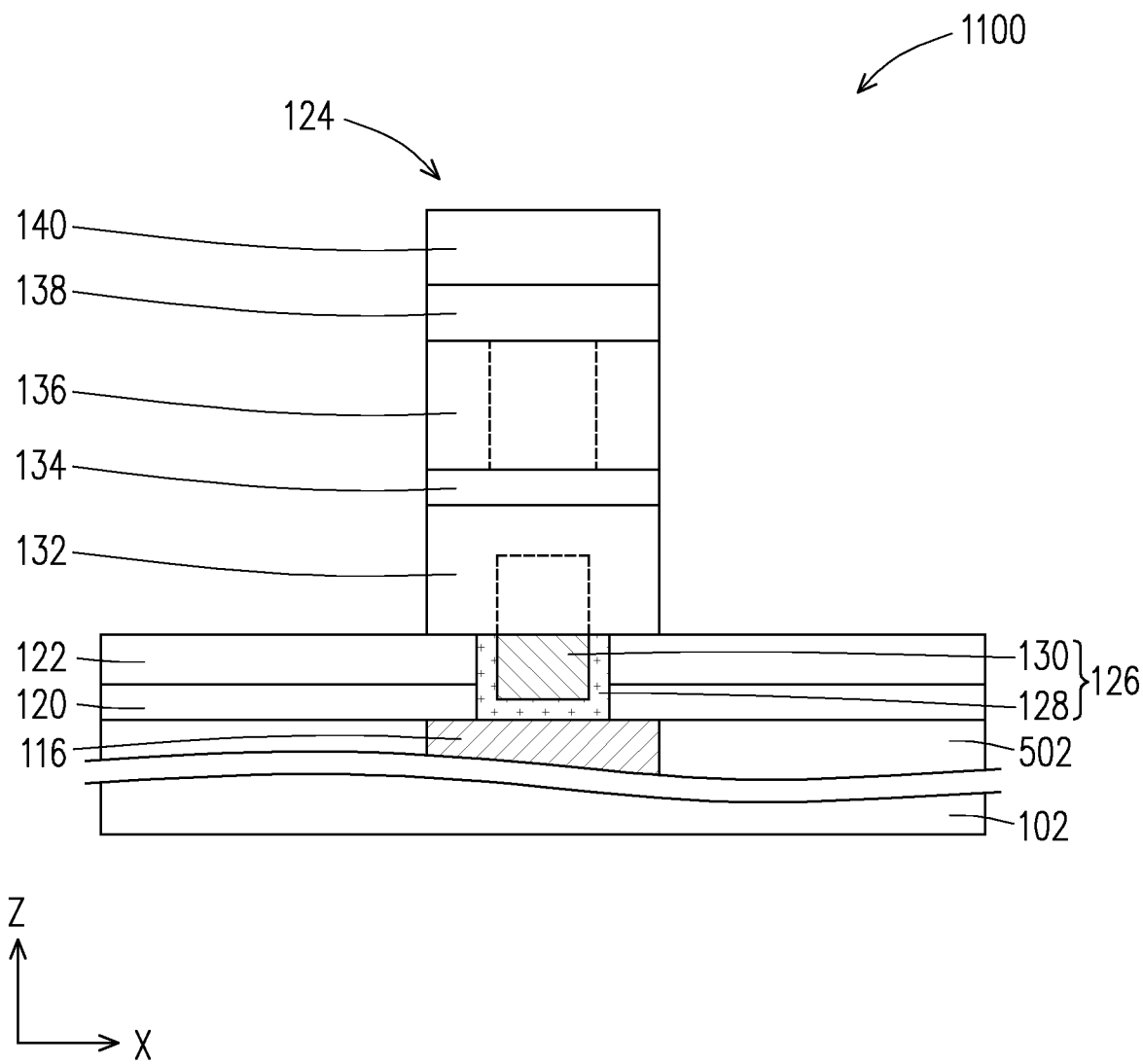

As shown in the schematic cross-sectional view 1100 of FIG. 11H, the conductive layer 808, the resistance variable material layer 806, the conductive layer 804 and the phase change material layer 802 are patterned to form the top electrode 138, the resistance variable layer 136, the interfacial conductive layer 134 and the phase change layer 132. In this stage, the memory cell 124 including the bottom electrode 126, the phase change layer 132, the interfacial conductive layer 134, the resistance variable layer 136, the top electrode 138 and the hard mask 140 is formed. In some embodiments, the patterning process for forming the top electrode 138, the resistance variable layer 136, the interfacial conductive layer 134 and the phase change layer 132 uses the overlying hard mask 140 as a patterning mask, rather than using a photoresist pattern that is defined by a photolithography process. In these embodiments, such patterning process can be regarded as a self-aligning patterning process. In some embodiments, the patterning process for forming the top electrode 138, the resistance variable layer 136, the interfacial conductive layer 134 and the phase change layer 132 includes an etching process. In some embodiments, the patterning process for forming the top electrode 138, the resistance variable layer 136, the interfacial conductive layer 134 and the phase change layer 132 includes an anisotropic etching process. In some embodiments, the hard mask 140 may be thinned during the formation of the top electrode 138, the resistance variable layer 136, the interfacial conductive layer 134 and the phase change layer 132. Although the dielectric layer 122 presented in FIG. 11H is not thinned for illustrative purposes, those skilled in the art can understand that during the formation of the top electrode 138, the resistance variable layer 136, the interfacial conductive layer 134 and the phase change layer 132, portions of the dielectric layer 122 not covered by the hard mask 140 are thinned. In these embodiments, since a thickness of other portion of the dielectric layer 122 lying under the hard mask 140 remains unchanged, a step height (not shown) between different portions of the dielectric layer 122 may exist. In some embodiments, the step height ranges from greater than about 0 Å to about 150 Å.

Figure 11I:
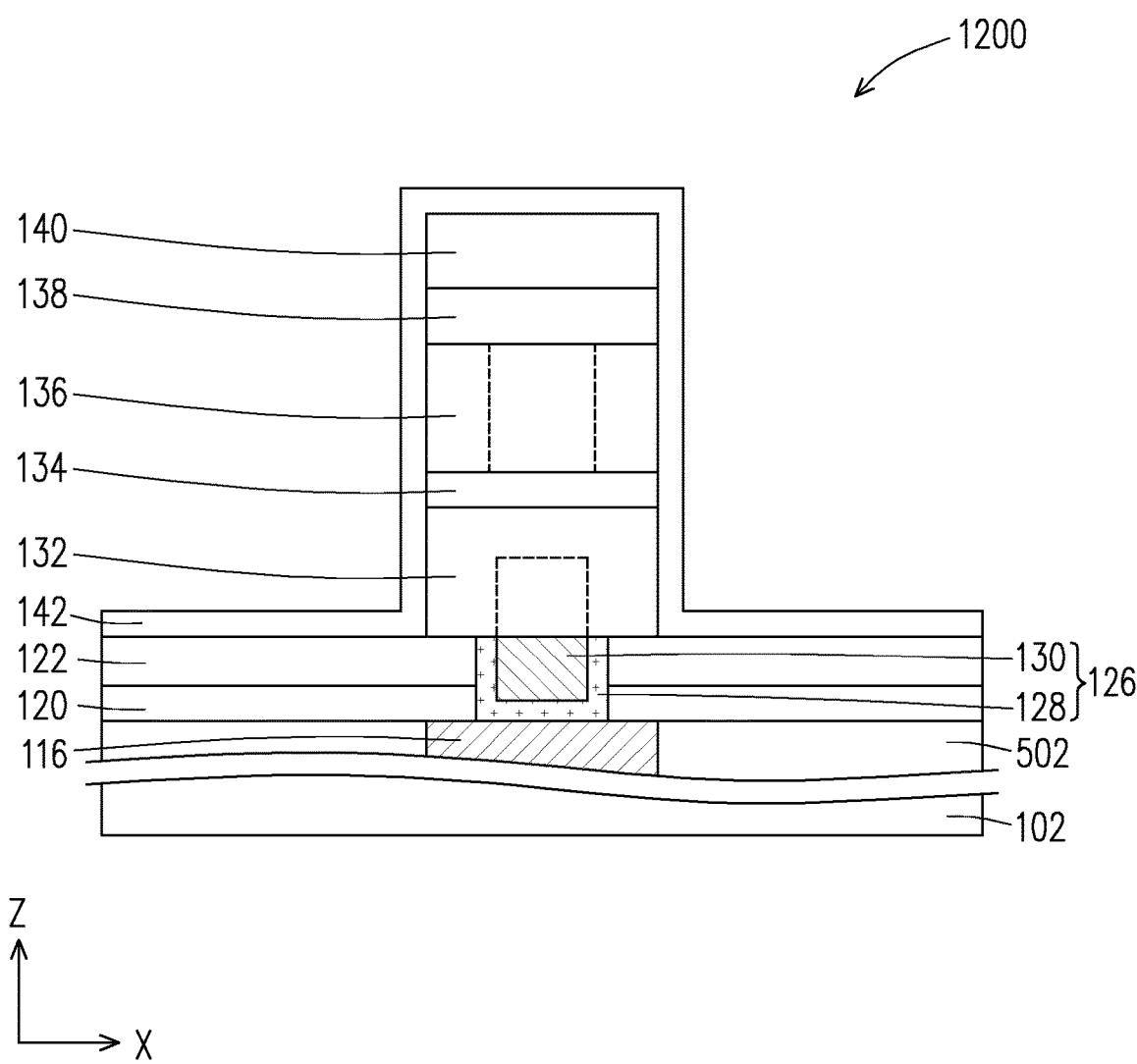

As shown in the schematic cross-sectional view 1200 of FIG. 11I, the passivation layer 142 is formed over the substrate 102 and the memory cell 124. In some embodiments, the passivation layer 142 is conformally formed over the dielectric layer 122, the phase change layer 132, the interfacial conductive layer 134, the resistance variable layer 136, the top electrode 138 and the hard mask 140. In this way, the exposed surfaces of the dielectric layer 122, the phase change layer 132, the interfacial conductive layer 134, the resistance variable layer 136, the top electrode 138 and the hard mask 140 are currently covered by the passivation layer 142. In some embodiments, the passivation layer 142 is formed by CVD, ALD, PVD, a combination thereof, or other suitable deposition process.

Figure 11J:
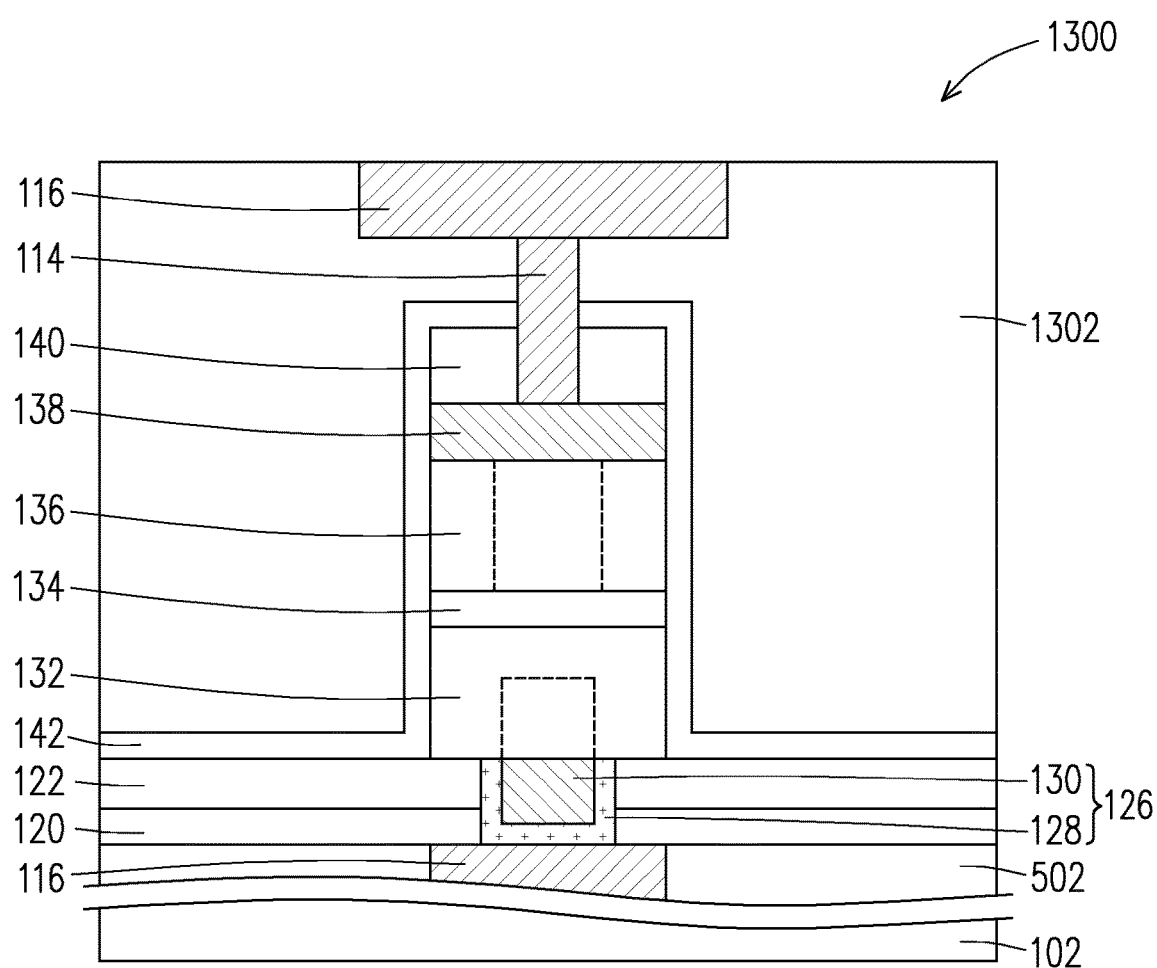

As shown in the schematic cross-sectional view 1300 of FIG. 11J, an upper ILD structure 1302 is formed over the passivation layer 142. In some embodiments, the upper ILD structure 1302 may be formed by CVD, PVD, ALD, or other suitable deposition process. Further, after forming the upper ILD structure 1302, the conductive via 114 and the conductive wire 116 over the top electrode 138 of the memory cell 124 are formed. The conductive via 114 penetrates the upper ILD structure 1302, the passivation layer 142 and the hard mask 140, so as to be electrically connected with the top electrode 138. The conductive via 114 and the conductive wire 116 are laterally surrounded by the upper ILD structure 1302. The conductive wire 116 is formed in electrical contact with the underlying conductive via 114. In some embodiments, the conductive via 114 and/or the conductive wire 116 is formed by a single damascene process or a dual damascene process.

In the memory device 100 illustrated in FIG. 1, the passivation layer 142 is physically and directly in contact with the sidewalls of the hard mask 140, the top electrode 138, the resistance variable layer 136, the interfacial conductive layer 134 and the phase change layer 132. However, the disclosure is not limited thereto. In some alternative embodiments, the passivation layer 142 may not directly in contact with the sidewalls of the hard mask 140, the top electrode 138, the resistance variable layer 136, the interfacial conductive layer 134 and the phase change layer 132. Hereinafter, other embodiments will be described with reference to FIG. 13.

Figure 13:
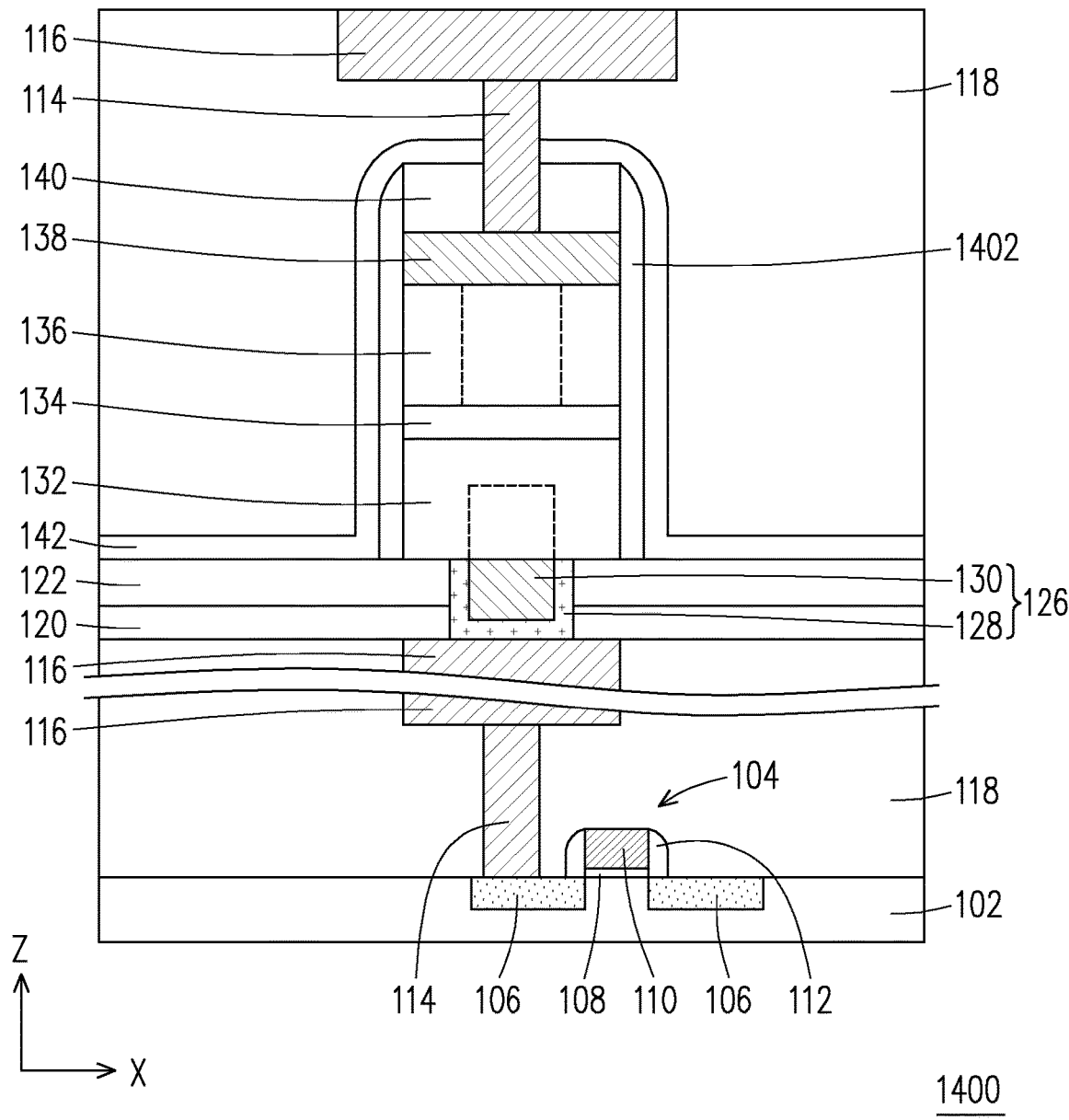
FIG. 13 is a schematic cross-sectional view illustrating a memory device according to some alternative embodiments of the present disclosure.

FIG. 13 is a schematic cross-sectional view illustrating a memory device 1400 according to some alternative embodiments of the present disclosure. The memory device 1400 illustrated in FIG. 13 is similar to the memory device 100 illustrated in FIG. 1, hence the same reference numerals are used to refer to the same or liked parts, and its detailed description will be omitted herein. The differences between the memory device 1400 and the memory device 100 will be described below.

Referring to FIG. 13, the memory device 1400 includes a sidewall spacer 1402 over the substrate 102. The sidewall spacer 1402 directly and continuously in contact with the sidewalls of the hard mask 140, the top electrode 138, the resistance variable layer 136, the interfacial conductive layer 134 and the phase change layer 132. That is to say, in some embodiments, the sidewall spacer 1402 laterally encloses the hard mask 140, the top electrode 138, the resistance variable layer 136, the interfacial conductive layer 134 and the phase change layer 132. Further, the passivation layer 142 directly contacts the outer sidewall of the sidewall spacer 1402 and extends continuously from the top surface of the hard mask 140 to the top surface of the dielectric layer 122. That is to say, in these embodiments, the passivation layer 142 laterally encloses the sidewall spacer 1402, and the passivation layer 142 directly in contact with the top surface of the hard mask 140 while spacing apart from the sidewalls of the hard mask 140, the top electrode 138, the resistance variable layer 136, the interfacial conductive layer 134 and the phase change layer 132 by the sidewall spacer 1402. In some embodiments, the sidewall spacer 1402 is or comprises silicon nitride, silicon oxide, silicon carbide or other suitable material. In some embodiments, the sidewall spacer 1402 is comprised of a material different from the passivation layer 142. In some embodiments, the sidewall spacer 1402 is comprised of the same material as the passivation layer 142. In some embodiments, the sidewall spacer 1402 is formed after the memory cell 124 is formed and before the passivation layer 142 is formed. In some embodiments, the sidewall spacer 1402 is formed by depositing a spacer material layer (not shown) onto the dielectric layer 122, the phase change layer 132, the interfacial conductive layer 134, the resistance variable layer 136, the top electrode 138 and the hard mask 140. In some embodiments, the spacer material layer is formed by PVD, ALD, CVD, PECVD, a combination thereof, or other suitable deposition process to a thickness in a range of between about 40 nm and about 60 nm. The spacer material layer is subsequently etched to remove the spacer material layer from horizontal surfaces, leaving the spacer material layer along the sidewalls of the phase change layer 132, the interfacial conductive layer 134, the resistance variable layer 136, the top electrode 138 and the hard mask 140 as the sidewall spacer 1402. In some embodiments, the spacer material layer is or comprises silicon nitride, silicon oxide, silicon oxynitride or other suitable material. In some embodiments, the spacer material layer is etched by an anisotropic etching process.

As above, the memory device according to embodiments of the present disclosure includes the combination of two types of data storage layers (e.g., the phase change layer and the resistance variable layer) in the stacking structure of the memory cell. With such configuration, the memory device can be used for multi-level programming. In some embodiments, the memory device can be used for 3 level programming which has 3 resistance states. By performing the set/reset programming operation with respect to the phase change layer and the set/reset programming operation with respect to the resistance variable layer, the memory device can be accurately programmed to a certain resistance state and can be switched between multiple resistance states (e.g., 3 resistance states). Accordingly, the varitation of the operation during the multi-level programming of the memory device can be reduced, the yield and the reliability performance of the memory device can thus be improved. From another point of view, with such configuration, the manufacturing process of the memory device can be compatible with the currently-adopted manufacturing process, thereby improving the production yield of the memory device.

In accordance with an embodiment, a memory device includes a bottom electrode, a first data storage layer, a second data storage layer, an interfacial conductive layer and a top electrode. The first data storage layer is disposed on the bottom electrode and in contact with the bottom electrode. The second data storage layer is disposed over the first data storage layer. The interfacial conductive layer is disposed between the first data storage layer and the second data storage layer. The top electrode is disposed over the second data storage layer.

In accordance with an embodiment, a memory device includes a semiconductor device, and a memory cell. The semiconductor device is formed on a surface region of a substrate. The memory cell lies over the semiconductor device and is electrically connected with the semiconductor device, wherein the memory cell includes a bottom electrode, a phase change layer, an interfacial conductive layer, a resistance variable layer and a top electrode. The phase change layer is disposed on the bottom electrode and in contact with the bottom electrode. The interfacial conductive layer is disposed on the phase change layer and in contact with the phase change layer. The resistance variable layer is disposed on the interfacial conductive layer and in contact with the interfacial conductive layer. The top electrode is disposed on the resistance variable layer and in contact with the resistance variable layer.

In accordance with an embodiment, a method of operating a memory device includes at least the following steps. A memory cell including a bottom electrode, a phase change layer, an interfacial conductive layer, a resistance variable layer and a top electrode is provided, wherein the phase change layer, the interfacial conductive layer and the resistance variable layer are disposed between the bottom electrode and the top electrode, the phase change layer is in contact with the bottom electrode, and the interfacial conductive layer is disposed between the phase change layer and the resistance variable layer. The memory cell is programmed into a first resistance state by applying a first current pulse across the bottom electrode and the top electrode, wherein the first resistance state is a state in which the phase change layer is in a low resistance state and the resistance variable layer is in a low resistance state. The memory cell is programmed into a second resistance state by applying a second current pulse across the bottom electrode and the top electrode, wherein the second resistance state is a state in which the phase change layer is in a high resistance state and the resistance variable layer is in the low resistance state. The memory cell is programmed into a third resistance state by applying a third current pulse across the bottom electrode and the top electrode, wherein the third resistance state is a state in which the phase change layer is in the low resistance state and the resistance variable layer is in a high resistance state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a bottom electrode;
   a first data storage layer, disposed on the bottom electrode and in contact with the bottom electrode;
   a second data storage layer, disposed over the first data storage layer, wherein a material of the second data storage layer includes a transitional metal oxide;
   an interfacial conductive layer, disposed between the first data storage layer and the second data storage layer; and
   a top electrode, disposed over the second data storage layer.

2. The memory device according to claim 1, wherein a material of the first data storage layer includes a chalcogenide material.

3. The memory device according to claim 1, wherein a material of the interfacial conductive layer includes titanium nitride (TiN), tantalum nitride (TaN) or tungsten.

4. The memory device according to claim 1, further comprising:
a hard mask, disposed over the top electrode.

5. The memory device according to claim 1, wherein along a direction perpendicular to a stacking direction of the bottom electrode and the first data storage layer, a dimension of the bottom electrode is less than a dimension of the first data storage layer.

6. The memory device according to claim 1, wherein the first data storage layer is configured to store a first low resistance state and a first high resistance state, the second data storage layer is configured to store a second low resistance state and a second high resistance state,
wherein the first data storage layer is configured to be transited between the first low resistance state and the first high resistance state, while the second data storage layer is configured to remain at the second low resistance state, and the second data storage layer is configured to be transited between the second low resistance state and the second high resistance state, while the first data storage layer is configured to remain at the first low resistance state, and
wherein a resistance value of the second data storage layer at the second high resistance state is less than a resistance value of the first data storage layer at the first high resistance state, and a resistance value of the second data storage layer at the second low resistance state is substantially equal to a resistance value of the first data storage layer at the first low resistance state.

7. A memory device, comprising:
a semiconductor device, formed on a surface region of a substrate; and
a memory cell, lying over the semiconductor device and electrically connected with the semiconductor device, wherein the memory cell comprises:
a bottom electrode;
a phase change layer, disposed on the bottom electrode and in contact with the bottom electrode;
an interfacial conductive layer, disposed on the phase change layer and in contact with the phase change layer;
a resistance variable layer, disposed on the interfacial conductive layer and in contact with the interfacial conductive layer; and
a top electrode, disposed on the resistance variable layer and in contact with the resistance variable layer.

8. The memory device according to claim 7, wherein the memory cell is configured to be programmed into a first resistance state, a second resistance state or a third resistance state,
wherein in the first resistance state, the phase change layer has a lowest resistance value and the resistance variable layer has a lowest resistance value; in the second resistance state, the phase change layer has a highest resistance value and the resistance variable layer has the lowest resistance value; and in the third resistance state, the phase change layer has the lowest resistance value and the resistance variable layer has a highest resistance value, and
wherein the highest resistance value of the resistance variable layer is less than the highest resistance value of the phase change layer, and the lowest resistance value of the resistance variable layer is substantially equal to the lowest resistance value of the phase change layer.

9. The memory device according to claim 7, wherein the bottom electrode comprises:
a conductive structure; and
a heat isolation layer covering a sidewall and a bottom surface of the conductive structure.

10. The memory device according to claim 7, further comprising:
an etch stop layer laterally surrounding the bottom electrode; and
a dielectric layer disposed on the etch stop layer and laterally surrounding the bottom electrode.

11. The memory device according to claim 7, further comprising a passivation layer covering the memory cell, wherein the memory cell further comprises a hard mask disposed on the top electrode and in contact with the top electrode, the passivation layer covers a top surface of the hard mask.

12. The memory device according to claim 7, wherein a sidewall of the phase change layer, a sidewall of the interfacial conductive layer, a sidewall of the resistance variable layer and a sidewall of the top electrode are substantially aligned with each other.

13. The memory device according to claim 7, wherein each of the phase change layer, the interfacial conductive layer, the resistance variable layer and the top electrode has a slanted sidewall.

14. The memory device according to claim 7, wherein the bottom electrode has a footprint area smaller than a footprint area of the phase change layer.

15. The memory device according to claim 7, wherein a thickness of the bottom electrode ranges from about 30 nm to about 60 nm, a thickness of the phase change layer ranges from about 20 nm to about 40 nm, a thickness of the interfacial conductive layer ranges from about 2 nm to about 4 nm, a thickness of the resistance variable layer ranges from about 5 nm to about 10 nm, and a thickness of the top electrode ranges from about 10 nm to about 15 nm.

16. A method of operating a memory device, comprising:
providing a memory cell over a semiconductor device and electrically connected with the semiconductor device, the semiconductor device being formed on a surface region of a substrate, and the memory cell including a bottom electrode, a phase change layer, an interfacial conductive layer, a resistance variable layer and a top electrode, wherein the phase change layer, the interfacial conductive layer and the resistance variable layer are disposed between the bottom electrode and the top electrode, the phase change layer is in contact with the bottom electrode, and the interfacial conductive layer is disposed between the phase change layer and the resistance variable layer and in contact with the phase change layer, the resistance variable layer is in contact with the interfacial conductive layer, and the top electrode is in contact with the resistance variable layer;
programming the memory cell into a first resistance state by applying a first current pulse across the bottom electrode and the top electrode, wherein the first resistance state is a state in which the phase change layer is in a low resistance state and the resistance variable layer is in a low resistance state;
programming the memory cell into a second resistance state by applying a second current pulse across the bottom electrode and the top electrode, wherein the second resistance state is a state in which the phase change layer is in a high resistance state and the resistance variable layer is in the low resistance state; and programming the memory cell into a third resistance state by applying a third current pulse across the bottom electrode and the top electrode, wherein the third resistance state is a state in which the phase change layer is in the low resistance state and the resistance variable layer is in a high resistance state.

17. The method of claim 16, wherein the first current pulse has a first polarity while the third current pulse has a second polarity opposite to the first polarity.

18. The method of claim 16, wherein an amplitude of the first current pulse is smaller than an amplitude of the second current pulse, and a duration time of the first current pulse is longer than a duration time of the second current pulse.

19. The method of claim 16, wherein a resistance value of the resistance variable layer at the high resistance state is less than a resistance value of the phase change layer at the high resistance state.

20. The memory device according to claim 1, wherein the bottom electrode comprises:
   a conductive structure; and
   a heat isolation layer covering a sidewall and a bottom surface of the conductive structure.

* * * * *